United States Patent
Kawahara et al.

(10) Patent No.: US 12,024,772 B2
(45) Date of Patent: Jul. 2, 2024

(54) APPARATUSES FOR THIN FILM DEPOSITION

(71) Applicant: ASM IP HOLDING B.V., Almere (NL)

(72) Inventors: Jun Kawahara, Tokyo (JP); Suvi Haukka, Helsinki (FI); Antti Niskanen, Helsinki (FI); Eva Tois, Espoo (FI); Raija Matero, Helsinki (FI); Hidemi Suemori, Almere (NL); Jaako Anttila, Helsinki (FI); Yukihiro Mori, Tokyo (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/811,978

(22) Filed: Jul. 12, 2022

(65) Prior Publication Data
US 2022/0341040 A1    Oct. 27, 2022

Related U.S. Application Data

(62) Division of application No. 14/811,528, filed on Jul. 28, 2015, now Pat. No. 11,421,321.

(51) Int. Cl.
| | | |
|---|---|---|
| *C23C 16/455* | (2006.01) | |
| *C23C 16/458* | (2006.01) | |
| *C23C 16/52* | (2006.01) | |
| *C23C 16/54* | (2006.01) | |

(Continued)

(52) U.S. Cl.
CPC .. *C23C 16/45527* (2013.01); *C23C 16/45544* (2013.01); *C23C 16/4583* (2013.01); *C23C 16/52* (2013.01); *C23C 16/54* (2013.01); *H01L 21/67161* (2013.01); *H01L 21/67167* (2013.01);

(Continued)

(58) Field of Classification Search
CPC ........ C23C 16/45525; C23C 16/45527; C23C 16/45544; C23C 16/45551; C23C 16/52
See application file for complete search history.

(56) References Cited

U.S. PATENT DOCUMENTS

| | | | |
|---|---|---|---|
| 3,675,563 | A | 7/1972 | Metreaud |
| 4,764,076 | A | 8/1988 | Layman et al. |
| 5,292,393 | A | 3/1994 | Maydan et al. |

(Continued)

FOREIGN PATENT DOCUMENTS

| | | |
|---|---|---|
| EP | 0 699 777 | 3/1996 |
| JP | H03-274746 | 12/1991 |

(Continued)

OTHER PUBLICATIONS

U.S. Appl. No. 14/811,370, filed Jul. 28, 2015, Kawahara et al..

(Continued)

*Primary Examiner* — Dah-Wei D. Yuan
*Assistant Examiner* — Stephen A Kitt
(74) *Attorney, Agent, or Firm* — Banner & Witcoff, Ltd.

(57) ABSTRACT

In accordance with some embodiments herein, apparatuses for deposition of thin films are provided. In some embodiments, a plurality of stations is provided, in which each station provides a different reactant or combination of reactants. The stations can be in gas isolation from each other so as to minimize or prevent undesired chemical vapor deposition (CVD) and/or atomic layer deposition (ALD) reactions between the different reactants or combinations of reactants.

20 Claims, 29 Drawing Sheets

(51) Int. Cl.
*H01L 21/67* (2006.01)
*H01L 21/677* (2006.01)

(52) U.S. Cl.
CPC .. *H01L 21/67207* (2013.01); *H01L 21/67745* (2013.01)

(56) References Cited

U.S. PATENT DOCUMENTS

| | | |
|---|---|---|
| 5,379,984 A | 1/1995 | Coad et al. |
| 5,380,094 A | 1/1995 | Schmidt et al. |
| 5,460,478 A | 10/1995 | Akimoto et al. |
| 5,494,494 A | 2/1996 | Mizuno et al. |
| 5,514,260 A | 5/1996 | Seo |
| 5,525,160 A | 6/1996 | Tanaka et al. |
| 5,538,610 A | 7/1996 | Gesche et al. |
| 5,554,249 A | 9/1996 | Hasegawa et al. |
| 5,611,655 A | 3/1997 | Fukasawa et al. |
| 5,611,886 A | 3/1997 | Bachman et al. |
| 5,616,208 A | 4/1997 | Lee |
| 5,639,309 A | 6/1997 | Akimoto |
| 5,667,592 A * | 9/1997 | Boitnott ............ H01L 21/67196 204/298.25 |
| 5,755,888 A | 5/1998 | Torii et al. |
| 5,855,681 A | 1/1999 | Maydan et al. |
| 5,900,105 A | 5/1999 | Toshima |
| 6,077,157 A | 6/2000 | Fairbairn et al. |
| 6,086,680 A | 7/2000 | Foster et al. |
| 6,139,692 A | 10/2000 | Washburn et al. |
| 6,139,695 A | 10/2000 | Washburn et al. |
| 6,143,082 A | 11/2000 | McInerney et al. |
| 6,152,070 A | 11/2000 | Fairbairn et al. |
| 6,231,716 B1 | 5/2001 | White et al. |
| 6,446,646 B1 | 9/2002 | Izumi |
| 6,902,620 B1 | 6/2005 | Omstead et al. |
| 7,438,760 B2 | 10/2008 | Bauer et al. |
| 7,666,773 B2 | 2/2010 | Huotari et al. |
| 7,763,115 B2 | 7/2010 | Hatanaka et al. |
| 8,041,450 B2 | 10/2011 | Takizawa et al. |
| 8,043,432 B2 | 10/2011 | Dip |
| 8,347,813 B2 | 1/2013 | Kim et al. |
| 8,691,669 B2 | 4/2014 | Lee |
| 8,841,182 B1 | 9/2014 | Chen et al. |
| 8,846,550 B1 | 9/2014 | Shero et al. |
| 8,940,646 B1 | 1/2015 | Chandrasekharan et al. |
| 8,956,971 B2 | 2/2015 | Haukka et al. |
| 9,153,433 B2 | 10/2015 | Kato et al. |
| 9,960,072 B2 | 5/2018 | Coomer |
| 10,190,214 B2 | 1/2019 | Shon et al. |
| 10,204,790 B2 | 2/2019 | Kawahara et al. |
| 10,312,129 B2 | 6/2019 | Coomer |
| 10,329,669 B2 | 6/2019 | Cho |
| 10,332,767 B2 | 6/2019 | Omori |
| 10,358,721 B2 | 7/2019 | Kim et al. |
| 10,364,493 B2 | 7/2019 | Lee et al. |
| 10,403,523 B2 | 9/2019 | Kim et al. |
| 10,480,073 B2 | 11/2019 | Murakawa |
| 10,662,525 B2 | 5/2020 | Jang et al. |
| 10,738,381 B2 | 8/2020 | Jang et al. |
| 10,777,445 B2 | 9/2020 | Nishiwaki |
| 10,822,695 B2 | 11/2020 | Jang et al. |
| 10,867,786 B2 | 12/2020 | Choi |
| 10,876,218 B2 | 12/2020 | Yoo et al. |
| 2001/0011526 A1 | 8/2001 | Doering et al. |
| 2002/0100418 A1* | 8/2002 | Sandhu ............ C23C 16/45519 118/719 |
| 2002/0108570 A1 | 8/2002 | Lindfors |
| 2003/0038127 A1* | 2/2003 | Liu ................... H01L 21/6719 219/400 |
| 2003/0072975 A1 | 4/2003 | Shero et al. |
| 2004/0058293 A1 | 3/2004 | Nguyen |
| 2004/0131766 A1 | 7/2004 | Katsuoka |
| 2004/0149211 A1 | 8/2004 | Ahn et al. |
| 2004/0221808 A1* | 11/2004 | Kawano ............ F16J 15/0887 118/715 |
| 2005/0000937 A1 | 1/2005 | Chiang et al. |
| 2005/0034664 A1 | 2/2005 | Koh |
| 2005/0092247 A1 | 5/2005 | Schmidt et al. |
| 2005/0280050 A1 | 12/2005 | Doczy et al. |
| 2006/0009034 A1 | 1/2006 | Lai et al. |
| 2007/0026654 A1 | 2/2007 | Huotari et al. |
| 2007/0034479 A1 | 2/2007 | Todaka |
| 2008/0075858 A1* | 3/2008 | Koh .................. C23C 16/405 118/704 |
| 2008/0193643 A1 | 8/2008 | Dip |
| 2008/0200019 A9 | 8/2008 | Huotari et al. |
| 2008/0226842 A1 | 9/2008 | Vukovic |
| 2008/0241384 A1 | 10/2008 | Jeong |
| 2008/0241387 A1 | 10/2008 | Keto |
| 2009/0104351 A1 | 4/2009 | Kakegawa |
| 2010/0010491 A1 | 1/2010 | Alda |
| 2010/0071730 A1 | 3/2010 | Ravkin et al. |
| 2010/0101491 A1 | 4/2010 | Aida |
| 2010/0102417 A1 | 4/2010 | Ganguli et al. |
| 2010/0107978 A1 | 5/2010 | Todd et al. |
| 2011/0263115 A1 | 10/2011 | Ganguli et al. |
| 2011/0298062 A1 | 12/2011 | Ganguli et al. |
| 2012/0322250 A1 | 12/2012 | Ganguli et al. |
| 2013/0189837 A1 | 7/2013 | Haukka et al. |
| 2013/0196078 A1 | 8/2013 | Yudovsky |
| 2013/0210238 A1 | 8/2013 | Yudovsky |
| 2013/0269609 A1 | 10/2013 | Leeser |
| 2014/0105709 A1 | 4/2014 | Abarra et al. |
| 2014/0127405 A1 | 5/2014 | Li et al. |
| 2015/0217330 A1 | 8/2015 | Haukka et al. |
| 2015/0225848 A1 | 8/2015 | Han et al. |
| 2015/0299848 A1 | 10/2015 | Haukka et al. |
| 2015/0368798 A1 | 12/2015 | Kwong |
| 2015/0376786 A1 | 12/2015 | Yudovsky et al. |
| 2017/0029947 A1 | 2/2017 | Kawahara et al. |
| 2017/0029948 A1 | 2/2017 | Jongbloed et al. |
| 2017/0032956 A1 | 2/2017 | Kawahara et al. |
| 2018/0187304 A1 | 7/2018 | Liu |
| 2019/0311940 A1 | 10/2019 | Choi et al. |
| 2019/0346300 A1 | 11/2019 | Kim et al. |
| 2019/0390343 A1 | 12/2019 | Min et al. |
| 2020/0071828 A1 | 3/2020 | Jongbloed et al. |
| 2020/0224308 A1 | 7/2020 | Jang et al. |
| 2020/0286719 A1 | 9/2020 | Nishiwaki |
| 2021/0054519 A1 | 2/2021 | Yoo et al. |
| 2021/0166910 A1 | 6/2021 | Kim et al. |
| 2021/0180188 A1 | 6/2021 | Kim et al. |
| 2021/0257509 A1 | 8/2021 | Nishiwaki |
| 2021/0319982 A1 | 10/2021 | Kim et al. |
| 2021/0398826 A1 | 12/2021 | Mori |
| 2022/0044956 A1 | 2/2022 | Choi et al. |
| 2022/0119944 A1 | 4/2022 | Yoshimoto et al. |

FOREIGN PATENT DOCUMENTS

| | | |
|---|---|---|
| JP | H07-321178 | 12/1995 |
| JP | 2014-082419 | 5/2014 |
| JP | 2014-201804 | 10/2014 |
| WO | WO 1995/04168 | 2/1995 |
| WO | WO 2014/030973 | 2/2014 |
| WO | WO 2014/127363 | 8/2014 |
| WO | WO 2014/130670 | 8/2014 |

OTHER PUBLICATIONS

U.S. Appl. No. 14/811,435, filed Jul. 28, 2015, Jongbloed et al..
Bien et al., "Multiple Self-Aligned Iron Nanowires by a dual selective chemical vapor deposition process", Electrochemical and Solid-state Letters, vol. 10, H251-H253 (2007).
File History of U.S. Appl. No. 14/811,370, filed Jul. 28, 2015.
File History of U.S. Appl. No. 14/811,435, filed Jul. 28, 2015.
File History of U.S. Appl. No. 16/677,446, filed Nov. 7, 2019.
International Search Report and Written Opinion dated Sep. 16, 2016 in Application No. PCT/US2016/040350.
International Search Report and Written Opinion dated Sep. 26, 2016 in Application No. PCT/US2016/040349.
Office Action dated Jan. 20, 2020 in corresponding Taiwanese Patent Application No. 105122151 in 9 pages.

(56) References Cited

OTHER PUBLICATIONS

Office Action dated May 20, 2020 in corresponding Taiwanese Patent Application No. 105122151 in 12 pages.
Office Action dated Oct. 15, 2019 in corresponding Taiwanese Patent Application No. 105122325 in 11 pages.
Puurunen et al., "Successive reactions of gaseous trimethylaluminium and ammonia on porous alumina", Phys. Chem. Chem. Phys., 2001, vol. 3, pp. 1093-1102.
Tischler et al., "Growth and Characterization of Compound Semiconductors by Atomic Layer Epitaxy", Journal of Crystal Growth, vol. 77, pp. 89-94, 1986.

* cited by examiner

*Process step 1 ~*

Combination 1

Combination 2

Combination2

RC1
  Process step 1

RC2
  Process step 2

RC3
  Process step 3

RC3
  Process step 4

|   | Optional pulse | purge | Pulse 1 | purge | Pulse 2 | purge | Pulse 3 |
|---|---|---|---|---|---|---|---|
| 1 | $O_2$ | | $Ru(EtCp)_2$ | | $O_2$ | | passivation chemical |
| 2 | $O_2$ | | $Ru(EtCp)_2$ | | $O_2$ | | $Ru(EtCp)_2$ |
| 3 | $O_2$ | | $Ru(EtCp)_2$ | | $O_2$ | | co-flow of passivation chemical and $Ge(NMe_2)_4$ |
| 4 | $O_2$ | | $Ru(EtCp)_2$ | | $O_2$ | | $Ru(EtCp)_2$ |
| 5 | $O_3$ or $O_2$ plasma | | $Ru(EtCp)_2$ | | $O_3$ or $O_2$ plasma | | passivation chemical |
| 6 | $O_3$ or $O_2$ plasma | | $Ru(EtCp)_2$ | | $O_3$ or $O_2$ plasma | | passivation chemical |
| 7 | $O_3$ or $O_2$ plasma | | $Ru(EtCp)_2$ | | $O_3$ or $O_2$ plasma | | co-flow of passivation chemical and $Ge(NMe_2)_4$ |
| 8 | $O_3$ or $O_2$ plasma | | $Ru(EtCp)_2$ | | $O_3$ or $O_2$ plasma | | co-flow of passivation chemical and $Ge(NMe_2)_4$ |

Fig. 8B$_1$

| Fig. 8B$_1$ | Fig. 8B$_2$ |
|---|---|
| Fig. 8B$_3$ | Fig. 8B$_4$ |

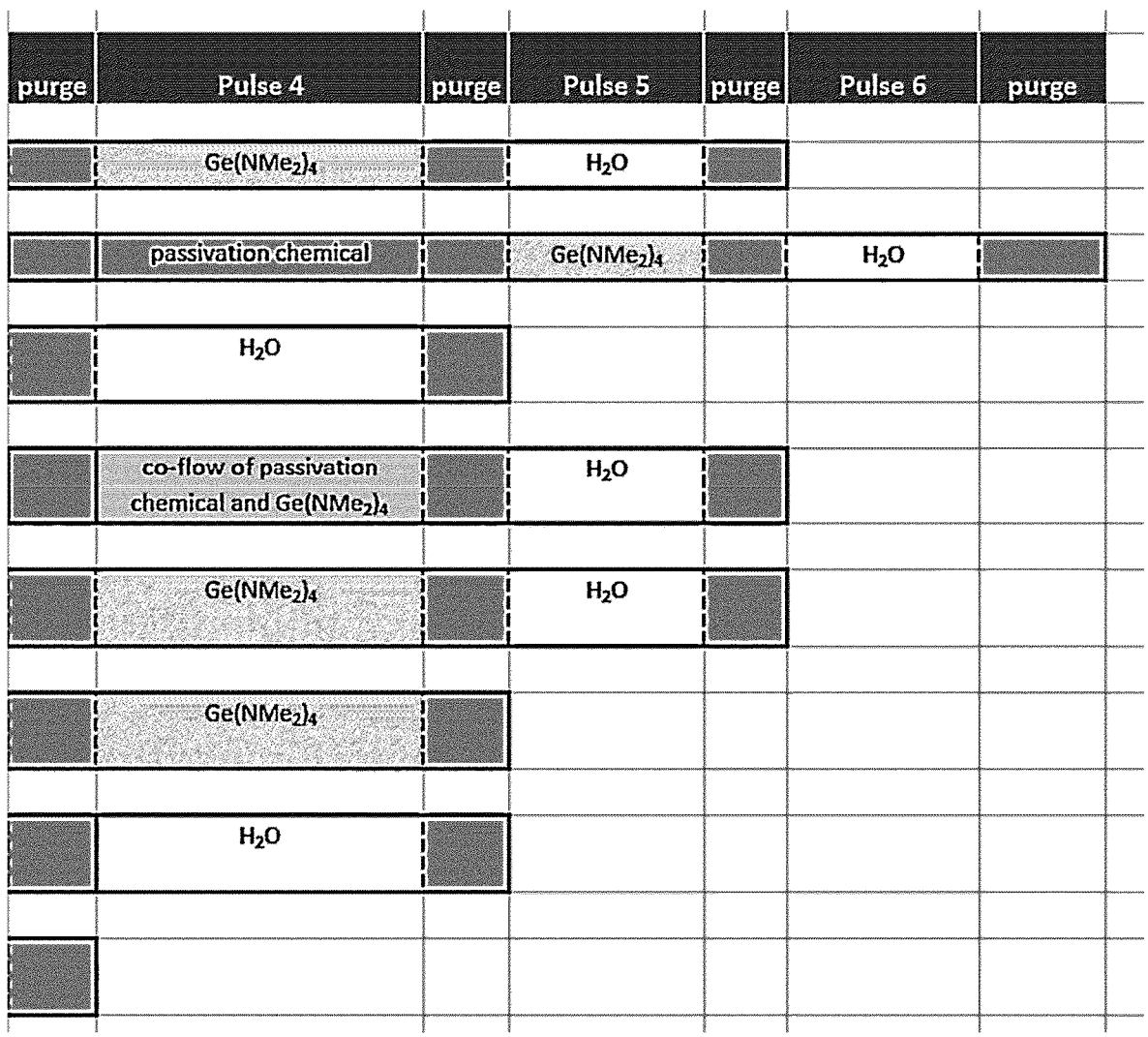
Fig. 8B$_2$

| | | | |
|---|---|---|---|
| 8 | O₃ or O₂ plasma | Ru(EtCp)₂ | O₃ or O₂ plasma |
| 9 | O₃ or O₂ plasma | Ru(EtCp)₂ | co-flow of passivation chemical and Ge(NMe₂)₄ |
| 10 | O₃ or O₂ plasma | Ru(EtCp)₂ | co-flow of passivation chemical and Ge(NMe₂)₄ |
| 11 | O₃ or O₂ plasma | Ru(EtCp)₂ | co-flow of passivation chemical and Ge(NMe₂)₄ |
| 12 | O₃ or O₂ plasma | Ru(EtCp)₂ | O₃ or O₂ plasma |
| 13 | O₃ or O₂ plasma | Ru(EtCp)₂ | passivation chemical |
| 14 | O₃ or O₂ plasma | Ru(EtCp)₂ | O₃ or O₂ plasma |
| 15 | O₃ or O₂ plasma | Ru(EtCp)₂ | O₃ or O₂ plasma |
| | | ☐ | 1. chamber |
| | | ☐ | 2. chamber |

Fig. 8B₃

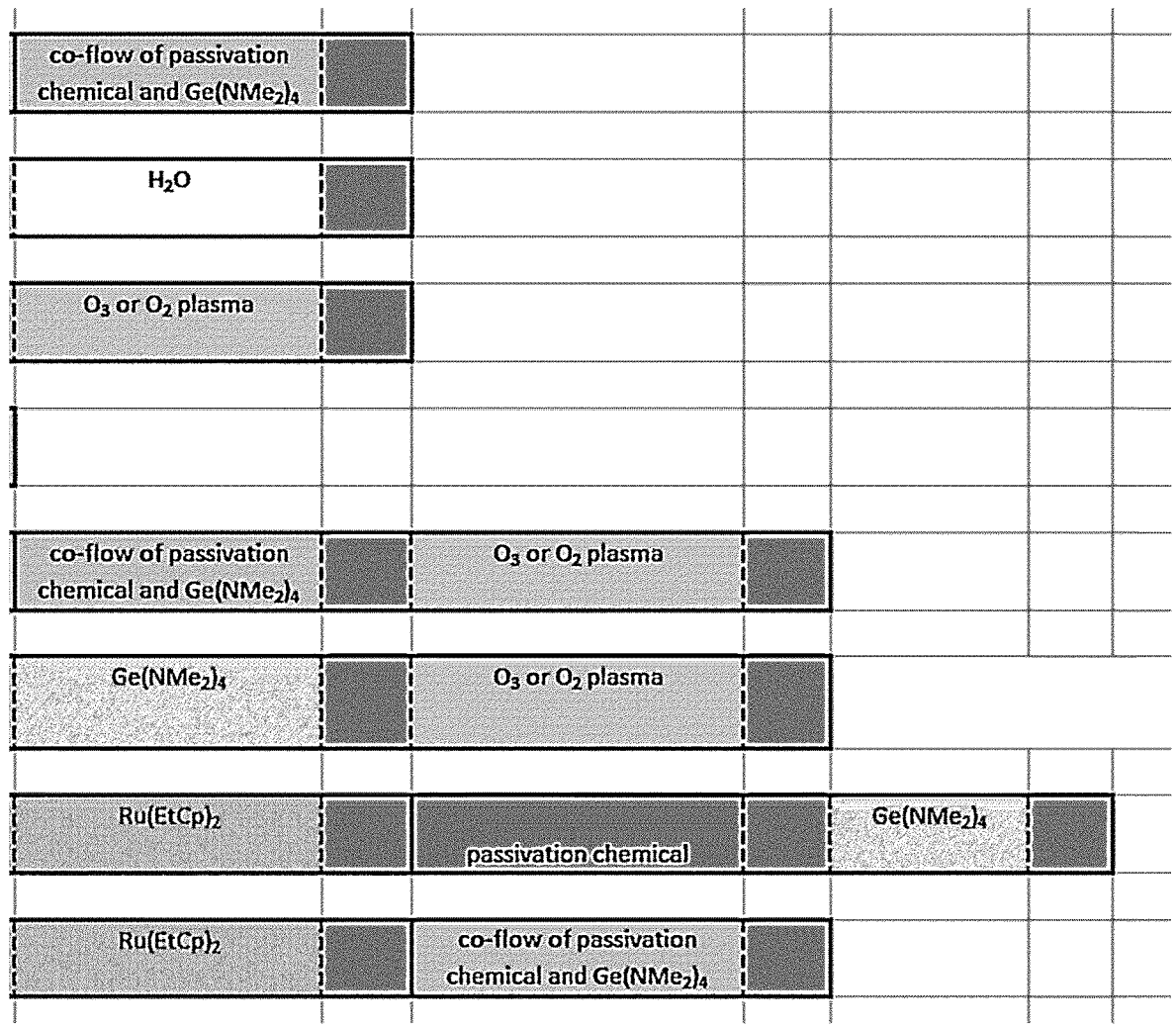
Fig. 8B$_4$

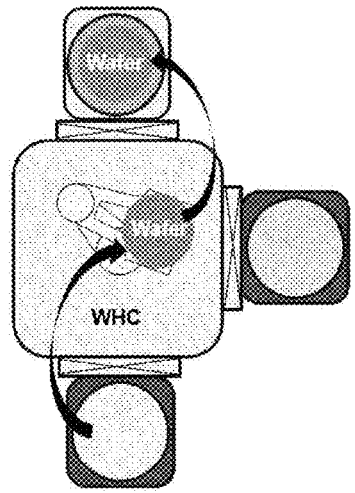
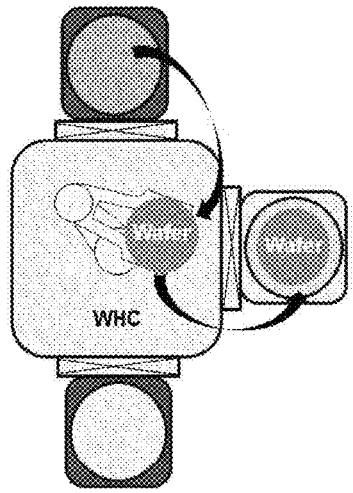
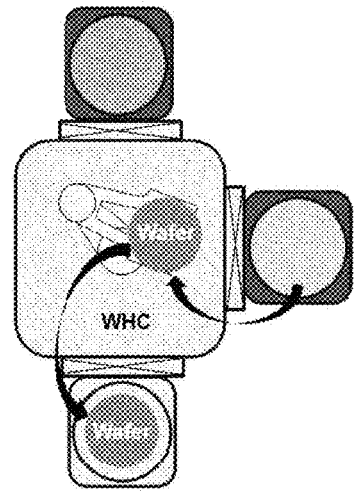
Fig. 14A  Fig. 14B  Fig. 14C
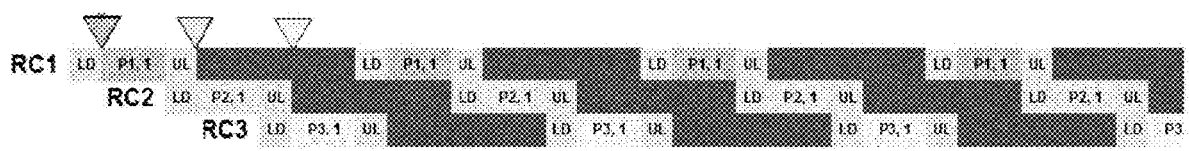
Fig. 14D (Prior art)

APPARATUSES FOR THIN FILM DEPOSITION

CROSS-REFERENCE TO RELATED APPLICATIONS

The present application is a divisional of U.S. patent application Ser. No. 14/811,528, filed Jul. 28, 2015, which is related to copending applications entitled "Methods and Apparatuses for Temperature Indexed Thin Film Deposition" and "Methods for Thin Film Deposition", each of which was filed on the same date, and each of which are hereby incorporated by reference in its entirety.

BACKGROUND

Integrated circuits are typically manufactured by an elaborate process in which various layers of materials are sequentially constructed in a predetermined arrangement on a semiconductor substrate.

FIELD

Some embodiments herein relate to semiconductor fabrication, and methods and apparatuses for deposition of thin films using atomic layer deposition. A thin film can be deposited on a surface of the substrate using two or more stations that each provide a different reactant and are in gas isolation from each other.

SUMMARY

In some aspects, a method for selective atomic layer deposition (ALD) of a thin film is provided. The method can comprise providing a first substrate comprising a first exposed surface and a second exposed surface that is different from the first exposed surface. The method can comprise (a) placing the first substrate in a first station. The method can comprise (b) contacting the first substrate in the first station with a first reactant and substantially in the absence of a second reactant and while the first station is in gas isolation from a second station, in which the first reactant reacts preferentially with the first exposed surface relative to the second exposed surface, such that no more than one monolayer of the first reactant is adsorbed on the first exposed surface. The method can comprise (c) after contacting the first substrate in the first station with the first reactant, placing the first substrate in the second station. The method can comprise (d) contacting the first substrate in the second station with the second reactant and substantially in the absence of the first reactant and while the second station is in gas isolation from the first station, such that the second reactant is different from the first reactant, and reacts with the no more than one monolayer of the first reactant on the first exposed surface. The method can comprise repeating (a)-(d) until a first film of desired thickness is selectively deposited on the first exposed surface relative to the second exposed surface. In some embodiments, a film of at least about 1 nm is deposited, for example 1 nm, 2, 3, 4, 5, 6, 7, 8, 9, 10, 15, 20, 25, 30, 35, 40, 45, 50, 60, 70, 80, 90, or 100 nm, including ranges between any two of the listed values, for example 1 nm-100 nm, 1 nm-20 nm, 1 nm-10 nm, 1 nm-5 nm, 2 nm-100 nm, 2 nm-20 nm, 2 nm-10 nm, 2 nm-5 nm, 3-4 nm, 5 nm-100 nm, 5 nm-20 nm, 5 nm-10 nm, 10 nm-100 nm, or 10 nm-20 nm. In some embodiments, the first station provides no reactant other than the first reactant, and the second station provides no reactant other than the second reactant. In some embodiments, each surface of the first station is substantially in the absence of the second reactant throughout the method, and each surface of the second station is substantially in the absence of the first reactant throughout the method. In some embodiments, the first station is placed in gas isolation from the second station while the first substrate is in the first station. In some embodiments, the first station is in gas isolation from the second station prior to placement of the first substrate in the first station. In some embodiments, the method further comprises purging the first station while the first substrate is present therein after contacting the first substrate with the first reactant, and purging the second station while the first substrate is present therein after contacting the first substrate with the second reactant. In some embodiments, substantially no chemical vapor deposition (CVD) reactions occur on any surface of the first station, and substantially no CVD reactions occur on any surface of the second station. In some embodiments, after contacting the first substrate in the first station with the first reactant, the substrate is placed in the second station without being placed in an intermediate location. In some embodiments, the method further comprises placing the first substrate in a purge location after contacting the first substrate in the first station with the first reactant and prior to contacting the first substrate in the second station with the second reactant, and flowing inert gas into the purge location while the first substrate is present in the purge location, in which the purge location is not in gas communication with the first station, and is not in gas communication with the second station during purging. In some embodiments, the method further comprises, while the first substrate is not present in the first station, placing a second substrate in the first station, the second substrate comprising a third exposed surface and a fourth exposed surface that is different from the third exposed surface, and contacting the second substrate in the first station with the first reactant and substantially in the absence of the second reactant, such that in the first reactant reacts with the third exposed surface but not with the fourth exposed surface such that no more than one monolayer of the first reactant is adsorbed on the third exposed surface, and after contacting the second substrate in the first station with the first reactant, and after contacting the first substrate in the second station with the second reactant, placing the second substrate in the second station substantially in the absence of the first reactant and placing the first substrate in the first station substantially in the absence of the second reactant, thus swapping the first substrate and second substrate. In some embodiments, the cycle of (a)-(d) further comprises (e) placing the first substrate in a third station, and (f) contacting the first substrate in the third station with a third reactant and substantially in the absence of the first and second reactants and while the third station is in gas isolation from the first station and the second station, in which (e)-(f) can be performed before or after (a)-(d) and in which (a)-(d) in combination with (e)-(f) are repeated until a first film of desired thickness is selectively deposited on the first exposed surface relative to the second exposed surface. In some embodiments, the method further comprises, while repeating (a)-(d), placing a third substrate in a third station, the third substrate comprising a fifth exposed surface and sixth exposed surface that is different from the fifth exposed surface, and contacting the third substrate in the third station with the first reactant substantially in the absence of the second reactant, in which the third station is in gas isolation from the first station and second station, and in which the first reactant reacts with the fifth exposed surface but not the sixth exposed surface, such that no more than one monolayer of the first reactant is adsorbed on the fifth exposed surface, and after contacting the third substrate in the third station with the first reactant placing the third substrate in a fourth station, in which the fourth station is in gas isolation from the first station, second station, and third station, contacting the third substrate in the fourth station with the second reactant substantially in the absence of the first reactant, in which the second reactant reacts with the no more than one monolayer of the first reactant on the fifth exposed surface, and repeating contacting the third substrate in the third station with the first reactant substantially in the absence of the second reactant and contacting the third substrate in the fourth station with the second reactant substantially in the absence of the first reactant until a second film of desired thickness is selectively deposited on the fifth surface but not on the sixth surface. In some embodiments, at least one solid material provides gas isolation between the first and second stations. In some embodiments, a gas provides gas isolation between the first and second stations. In some embodiments, the first station is in a fixed location relative to the second station. In some embodiments, placing the first substrate in the second station comprises rotating a substrate holder that holds the first substrate, thereby placing the first substrate in the second station. In some embodiments, a spider places the first substrate in the first station, and places the first substrate in the second station. In some embodiments, after the spider places the first substrate in each station, the spider is retracted from the station so that the spider is not contacted by any reactant. In some embodiments, the first substrate is placed in a substrate holder at the first station, and placing the first substrate in a second station is performed without moving the substrate holder. In some embodiments, each station provides only a single reactant. In some embodiments, the first reactant is not flowed into the first station at the same time that the second reactant is flowed into the second station. In some embodiments, the first substrate is exposed to the first reactant in the first station at a different pressure than the first substrate is exposed to the second reactant at the second station. In some embodiments, the first film is not deposited on the second exposed surface. In some embodiments, the method further comprises a second selective ALD process that selectively deposits a second film on the second surface of the first substrate relative to the first surface of the first substrate in which the second film is different from the first film.

In some aspects, an atomic layer deposition (ALD) reactor is provided. The reactor can comprise a first station and a second station. The first station can be configured to contain a first substrate and to contact the first substrate with a first reactant in gas isolation from the second station, such that no more than one monolayer of the first reactant is adsorbed on the first substrate. The second station can be configured to contain the first substrate and to contact the first substrate with a second reactant in gas isolation from the first station and substantially in the absence of the first reactant, such that the second reactant is different from the first reactant and reacts with the no more than one monolayer of the first reactant on the first substrate to form a desired material. The reactor can comprise a transfer system configured to place the first substrate in the second station after contacting the first substrate with the first reactant, and configured to place the first substrate in the first station after contact the first substrate with the second reactant. The reactor can comprise an intermediate space, outside of the first station and the second station, configured to accommodate the transfer system. The reactor can comprise a controller set to control a cycle of: moving the substrate via the transfer system to the first station, move the transfer system to the intermediate space, directing the first station to contact the first substrate with the first reactant, moving the substrate to the second station via the transfer system, moving the transfer system to the intermediate space, and directing the second station to contact the first substrate with the second reactant, and further set to repeat the cycle until a film of desired thickness is selectively formed on the first surface but not the second surface, such that no surface of the ALD reactor is substantially contacted with more than one of the first reactant and second reactant. In some embodiments, the ALD reactor is configured for selective deposition, in which the substrate comprises a first surface and a second surface that is different from the first surface, in which the first reactant is selectively adsorbed on the first surface relative to the second surface, in which the second reactant reacts with the no more than one monolayer of the first reactant on the first substrate, but does not react with the second surface, and in which the film of desired thickness is selectively deposited on the first surface relative to the second surface. In some embodiments, the ALD reactor further comprises a purge location, configured to receive the first substrate after contacting the first substrate with the first reactant, but prior to placing the first substrate in the second station, in which the purge location is configured to perform a purge with the first substrate therein, and in which the purge location is not in gas communication with the first station, and is not in gas communication with the second station. In some embodiments, purge location comprises the intermediate space. In some embodiments, the first station is configured to purge the first reactant after contacting the first substrate with the first reactant, and before placing the first substrate in the second station. In some embodiments, the ALD reactor is configured to prevent the simultaneous presence of substantial quantities of the first reactant and the second reactant in any station of the ALD reactor. In some embodiments, the ALD reactor is configured to substantially prevent chemical vapor deposition (CVD) reactions from occurring on any surface of the first and second stations of the ALD reactor. In some embodiments, the ALD reactor further comprises at least one solid material that provides gas isolation between the first and second stations. In some embodiments, gas isolation between the first and second stations is not provided by a gas bearing. In some embodiments, the first station is in a fixed location relative to the second station. In some embodiments, the transfer system comprises a rotating substrate holder configured to remove the first substrate from the first station and place the first substrate in the second station by rotation. In some embodiments, the transfer system comprises a spider. In some embodiments, each station is configured to contain a movable stage configured to move the substrate from the station to the intermediate space, and the substrate transfer member is configured to place a substrate on the movable stage and remove a substrate from the movable stage in the intermediate space, but the substrate transfer member is not configured to place a substrate in or remove a substrate from the station itself. In some embodiments, the ALD reactor further comprises a first gas line placing the first station in gas communication with the first reactant, and a second gas line placing the second station in gas communication with the second reactant, in which the first gas line is separate from the second gas line. In some embodiments, the ALD reactor further comprises a third station in gas isolation from the first station and second station, the third station configured to hold a second substrate, in which the third station is configured to contact the second substrate with the first reactant, in which the first reactant reacts with the second substrate such that no more than one monolayer of the first reactant is absorbed on the second substrate, and a fourth station in gas isolation from the first station, second station, and third station, in which the fourth station is configured to contact the second substrate with the second reactant substantially in the absence of the first reactant, in which the second reactant reacts with the no more than one monolayer of the first reactant on the second substrate thereby forming a desired material on the second substrate. In some embodiments, the ALD reactor further comprises a third station in gas isolation from the first station and second station, the third station configured to contain the first substrate, in which the third station is configured to contact the first substrate with a third reactant that is different from the first and second reactants, thereby adsorbing no more than one monolayer of the third reactant on the second exposed surface, and a fourth station in gas isolation from the first station, second station, and third station and configured to contain the first substrate, wherein the fourth station is configured to contact the first substrate with a fourth reactant that is different from the first, second, and third reactants, and substantially in the absence of the first, second, and third reactants, in which the fourth reactant reacts with the no more than one monolayer of the third reactant but not the first exposed surface, such that no more than one monolayer of the fourth reactant is adsorbed on the second exposed surface. In some embodiments, the first station is configured to be placed in gas isolation from the second station while the first substrate is in the first station. In some embodiments, the first station is configured to be in gas isolation from the second station prior to placement of the first substrate in the first station. In some embodiments, the second station is configured to be placed in gas isolation from the first station while the first substrate is in the second station. In some embodiments, the second station is configured to be in gas isolation from the first station prior to placement of the first substrate in the second station.

In some aspects, a reactor for deposition on a substrate is provided. The reactor can comprise a first station configured to contain the substrate and provide a first reactant to the substrate. The reactor can comprise a second station configured to contain the substrate and provide a second reactant to the substrate, in which the second station is in gas isolation from the first station, and in which the second reactant is different from the first reactant. The reactor can comprise an intermediate space. The reactor can comprise a substrate transfer system comprising a spider configured to move the substrate via the intermediate space, in which no surface of the reactor is substantially contacted with both the first reactant and the second reactant. In some embodiments, the substrate transfer system further comprises a first moveable stage configured to move the substrate between the first station and the intermediate space, and a second moveable stage configured to move the substrate between the second station and the intermediate space, and the spider is configured to move the wafer from the first moveable stage to the second moveable stage. In some embodiments, each moveable stage comprises lift pins configured to lift the substrate off of the moveable stage in the intermediate space. In some embodiments, the reactor further comprises a plurality of moveable physical barriers that define at least a portion of the first station and the second station, in which the physical barriers can be moved to expose a substrate in a station to the intermediate space, and in which the spider is configured to move the substrate after the physical barriers have been moved to expose the substrate.

BRIEF DESCRIPTION OF THE DRAWINGS

FIGS. 14A and 14B and 14C are diagrams of a sequence of different process laminate in conventional tool configuration (repeating 3 different processes such as shown in FIG. 12 on a substrate). FIG. 14D illustrates the corresponding process flow for FIGS. 14A-C. It is noted that if the above-mentioned different process laminate is deposited on a substrate by these conventional tools, only one reaction chamber (RC) or unit of RCs works for processing while other RCs stay in waiting status, therefore, we can't make an efficient process flow.

FIG. 16 shows the stages in the "up" position, placing the stations in gas isolation from each other.

FIG. 17 shows the stages in the "down" position, so as to provide an intermediate space commonly accessible from the stations.

DETAILED DESCRIPTION

Figure 1A:
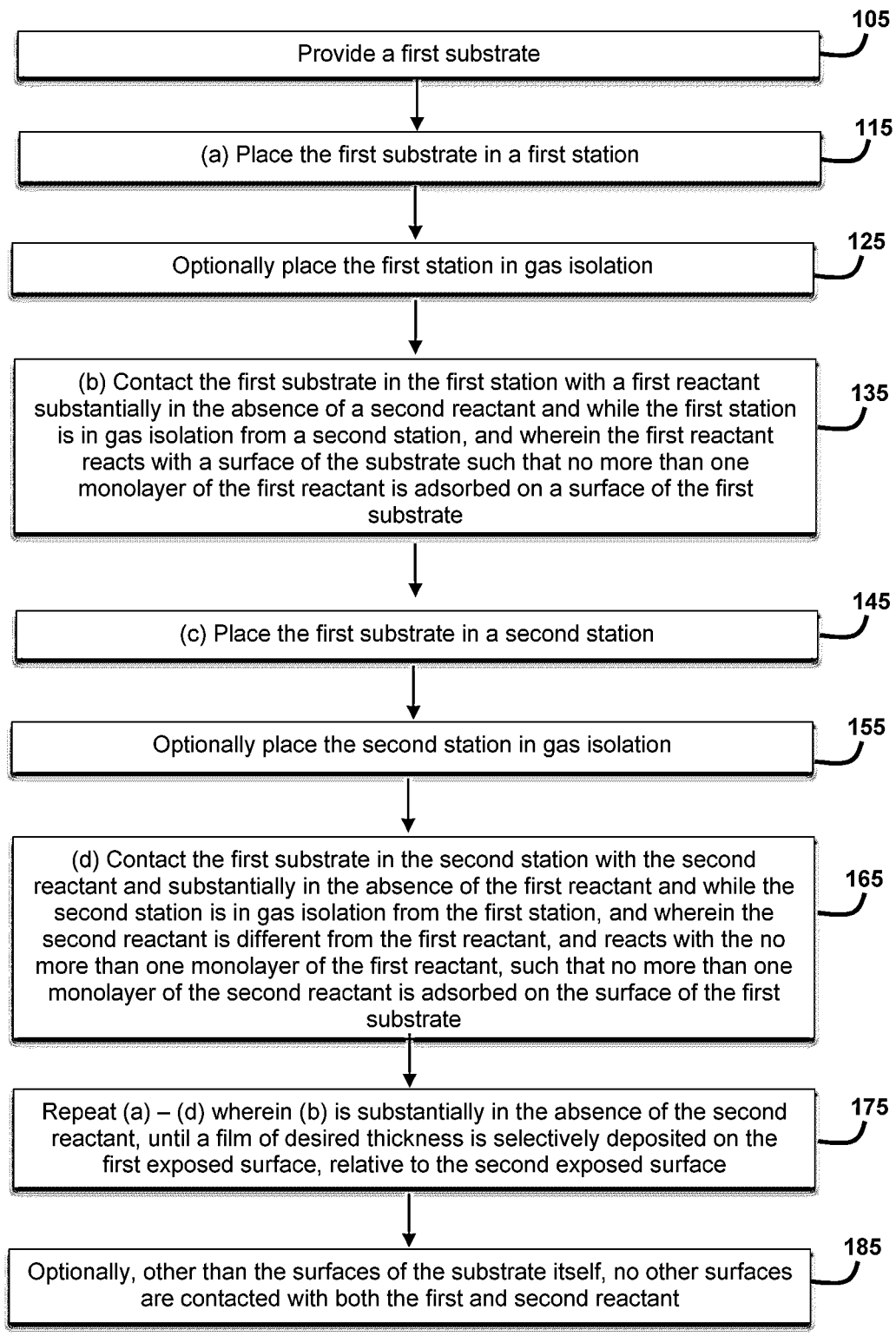
FIG. 1A is a flow diagram illustrating methods of Atomic Layer Deposition in accordance with some embodiments herein.

In accordance with some embodiments herein, a thin film can be deposited by Atomic Layer Deposition (ALD). A substrate can be placed in a first station, and contacted with a first reactant so that no more than a monolayer of the first reactant is adsorbed on the substrate. The substrate can then be placed in a second station in the absence (or substantial absence) of the first reactant, and contacted with a second reactant that reacts with the adsorbed first reactant. The cycle can be repeated. The stations can be in gas isolation from each other, such that each station provides no more than one reactant, and so that no surface of any station is contacted with more than one reactant. Without being limited by any theory, it is contemplated that maintaining spatial and/or temporal isolation between the reactants can minimize undesired ALD and/or CVD on surfaces other than the substrate. In some embodiments, selective ALD, for example single-selective or dual-selective ALD is performed.

In accordance with some embodiments herein, a thin film can be selectively deposited on a first surface of a substrate relative to a second, different surface of the substrate by Atomic Layer Deposition (ALD). The substrate can be placed in a first station, in which a first reactant is contacted with the substrate so that no more than a monolayer of the first reactant is preferentially adsorbed on a first exposed surface of the substrate relative to a second exposed surface of the substrate. The substrate can then be placed in a second station in which a second reactant is contacted with the substrate in the absence (or substantial absence) of the first reactant. The second reactant can preferentially react with the adsorbed first reactant, so that no more than a monolayer of the second reactant is adsorbed over the first surface of the substrate of the substrate relative to the second surface. Optionally, the substrate can repeatedly be moved between the first and second stations until a thin film of a desired thickness is formed. Optionally, the first reactant is adsorbed on the first exposed surface but not the second exposed surface. Optionally, selectivity can be increased by increasing the spatial and/or temporal separation of gas phase reactants. The first and second stations can be in gas isolation during process steps so as to minimize undesired Chemical Vapor Deposition (CVD) reactions comprising the first and second reactants on other surfaces of the wafer or on the stations. For example, after contacting the wafer with a reactant in a station, that station can be purged before the wafer is moved to another station so as to minimize reactants being carried over to the other station.

Atomic Layer Deposition

ALD type processes are based on controlled, self-limiting surface reactions of precursor chemicals. Gas phase reactions are avoided by alternately and sequentially contacting the substrate with the precursors. Vapor phase reactants are separated from each other on the substrate surface, for example, by removing excess reactants and/or reactant byproducts from the reaction chamber between reactant pulses, or as described herein, by providing different reactants in different spaces and moving a substrate among the different spaces.

Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction can depend upon the surface termination and reactant species involved. Frequently, a substrate comprising a first surface and second, different surface (e.g. comprising a different composition and/or a different morphology or crystallinity) can be heated to a suitable deposition temperature, generally at lowered pressure. In accordance with some embodiments herein, the temperature varies depending on the type of film being deposited, for example at or below about 600° C., for example at or below 500° C., 450° C., 400° C., 350° C., 300° C., 250° C., 200° C., 150° C., 100° C., 50° C., or 20° C., including ranges between any two of the listed values, for example, 20° C.-500° C., 20° C.-400° C., 20° C.-300° C., 20° C.-200° C., 20° C.-100° C., 50° C.-500° C., 50° C.-400° C., 50° C.-300° C., 50° C.-200° C., 50° C.-100° C., 100° C.-500° C., 100° C.-400° C., 100° C.-300° C., 100° C.-200° C., 200° C.-500° C., 200° C.-400° C., or 200° C.-300° C.

The terms "wafer" and "substrate" are used interchangeably herein. The surface of the substrate can be contacted with a vapor phase first reactant. In some embodiments a pulse of vapor phase first reactant is provided to a reaction space containing the substrate. In some embodiments the substrate is moved to a reaction space where vapor phase first reactant is provided. Preferably, the vapor phase reactant is not present in the reaction space when the substrate is moved to the reaction space, and the vapor phase reactant is subsequently provided in the reaction space. In some embodiments, the vapor phase reactant is already present in the reaction space when the substrate is moved to the reaction space. Optionally, some vapor phase reactant is already present in the reaction space when the substrate is placed in the reaction space, and additional vapor phase second reactant is added to the reaction space thereafter. Conditions are preferably selected such that no more than about one monolayer of the first reactant is adsorbed on the substrate surface in a self-limiting manner. The appropriate contacting times can be readily determined by the skilled artisan based on the particular circumstances. Excess first reactant and reaction byproducts, if any, are removed from the substrate surface, such as by purging with an inert gas or by removing the substrate from the presence of the first reactant.

"Purging" means that vapor phase precursors and/or vapor phase byproducts are removed from the substrate surface such as by evacuating a chamber with a vacuum pump and/or by replacing the gas inside a reactor with an inert gas such as argon or nitrogen. Typical purging times (and suitable in accordance with some embodiments herein) are from about 0.05 to 20 seconds, more preferably between about 1 and 10 seconds, and still more preferably between about 1 and 2 seconds. However, other purge times can be utilized if necessary, such as where highly conformal step coverage over extremely high aspect ratio structures or other structures with complex surface morphology is needed, for example purge times of at least 20 seconds, for example at least 20 seconds, 25 seconds, 30 seconds, 40 seconds, or 50 seconds, including ranges between any two of the listed values.

The surface of the substrate can be contacted with a vapor phase second gaseous reactant. In some embodiments a pulse of a second gaseous reactant is provided to a reaction space containing the substrate. In some embodiments the substrate is moved to a reaction space where the vapor phase second reactant is provided. Optionally, the vapor phase second reactant is already present in the reaction space when the substrate is placed in the reaction space. Optionally, the vapor phase second reactant is not present in the reaction space when the substrate is placed in the reaction space, and the second reactant is subsequently added to the reaction space. Optionally, some vapor phase second reactant is already present in the reaction space when the substrate is placed in the reaction space, and additional vapor phase second reactant is added to the reaction space thereafter. Excess second reactant and gaseous byproducts of the surface reaction, if any, are removed from the substrate surface. The steps of contacting and removing are repeated until a thin film of the desired thickness has been selectively formed on the first surface of substrate, with each cycle leaving no more than a molecular monolayer. Additional phases comprising alternately and sequentially contacting the surface of a substrate with other reactants can be included to form more complicated materials, such as ternary materials.

As described herein, each phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage. Typically, no more than one molecular layer of material is deposited with each cycle (or less than one molecular layer of material is deposited with each cycle). However, in some embodiments more than one molecular layer can deposited during the cycle.

Removing excess reactants can include evacuating some of the contents of a reaction space and/or purging a reaction space with helium, nitrogen or another inert gas. In some embodiments, purging comprises turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. Contacting times can be on the order of minutes in some cases. The optimum contacting time can be determined by the skilled artisan based on the particular circumstances.

The mass flow rate of the precursors can also be determined by the skilled artisan. In some embodiments the flow rate of metal precursors is preferably between about 1 sccm and 1000 sccm without limitation, more preferably between about 100 sccm and 500 sccm. Example mass flow rates in accordance with some embodiments herein include at least 1 sccm, for example at least 10 sccm, 50 sccm, 100 sccm, 200 sccm, 300 sccm, 400 sccm, 500 sccm, 600 sccm, 700 sccm, 800 sccm, 900 sccm, or 1000 sccm, including ranges between any two of the listed values.

The pressure in a reaction chamber is typically from about 0.01 to about 20 mbar, more preferably from about 1 mbar to about 10 mbar, for example 1, 2, 3, 4, 5, 6, 7, 8, 9, or 10 m bar, including ranges between any two of the listed values. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperatures are discussed in greater detail below in reference to each type of thin film formed. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan. In some embodiments, the first and second reactants for an ALD reaction have the same growth temperature. In some embodiments, the first and second reactants for the ALD reaction have different growth temperatures. Optionally, the first reactant has a higher growth temperature than the second reactant. Optionally, the first reactant has a lower growth temperature than the second reactant. ALD in accordance with some embodiments herein can comprise thermal ALD. ALD in accordance with some embodiments herein can comprise thermal plasma assisted ALD or plasma enhanced ALD (PEALD).

Examples of suitable reactors that may be used include reactors with multiple stations, in which the stations are, or can be, placed in gas isolation from each other. ALD equipment is commercially available, for example, from ASM which is headquartered in Almere, Netherlands. In some embodiments a flow type ALD reactor is used. Preferably, reactants are kept separate until reaching the reaction chamber, such that shared lines for the precursors are minimized. However, other arrangements are possible, such as the use of a pre-reaction chamber as described in U.S. Patent Application Publication Nos. 2005/0092247 and 2002/0108570, the disclosures of which are incorporated herein by reference in their entireties.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Chemical Vapor Deposition

In some embodiments, a thin film or a portion of a thin film is deposited by chemical vapor deposition (CVD) using one or more precursors described herein. For example, in some embodiments, a film can be deposited by CVD prior to one or more cycles of ALD over the CVD-produced film, and/or following one or more cycles of ALD. For example, in some embodiments, CVD is performed on a desired substrate, but ALD is not. Deposition can be suitably conducted according to the various CVD methods. CVD methods are described, for example, in U.S. Pat. No. 7,438,760, which is incorporated by reference in its entirety herein. The disclosed methods in accordance with some embodiments herein can be suitably practiced by employing CVD. In some embodiments, CVD is thermal. In some embodiments, CVD comprises plasma-enhanced chemical vapor deposition (PECVD).

The CVD reactant and, optionally two or more reactants including an etchant gas and/or an electrical dopant precursor, are preferably introduced to the chamber in the form of separate gases or by intermixing to form a feed gas. The intermixing to form the feed gas may take place in the chamber or prior to introduction of the feed gas to the chamber. The total pressure in the CVD chamber is preferably in the range of about $10^{-5}$ Torr to about 1000 Torr, more preferably in the range of about $10^{-4}$ Torr to about atmospheric pressure, for example about 760 Torr. In some embodiments, the chemical vapor deposition conditions comprise a chamber pressure of at least about $10^{-5}$ Torr, preferably a chamber pressure of about 760 Torr or less, for example a pressure of about 760 Torr, 740 Torr, 720 Torr, 700 Torr, 680 Torr, 660 Torr, 640 Torr, 620 Torr, 600 Torr, 580 Torr, 560 Torr, 540 Torr, 520 Torr, 500 Torr, 480 Torr, 460 Torr, 440 Torr, 420 Torr, 400 Torr, 350 Torr, 300 Torr, 250 Torr, 200 Torr, 150 Torr, or less, or a pressure in the range of about $10^{-4}$ Torr to about 760 Torr, for example about $10^{-4}$ Torr, $10^{-3}$ Torr, $10^{-2}$ Torr, $10^{-1}$ Torr, 1 Torr, 5 Torr, 10 Torr, 30 Torr, 50 Torr, 100 Torr, 150 Torr, 200 Torr, 250 Torr, 300 Torr, 350 Torr, 400 Torr, 450 Torr, 500 Torr, 600 Torr, 650, 700 Torr, 750 Torr, or 760 Torr, including ranges between any two of the listed values. The chamber pressure may be referred to herein as a deposition pressure. The partial pressure of Sn precursor is preferably in the range of about 0.0001% to about 100% of the total pressure, more preferably about 0.001% to about 50% of the total pressure. In some embodiments, the temperature of the CVD reaction chamber is about 600° C. or less, for example about 550° C. or less. In some embodiments, the temperature of the reaction chamber is about 500° C. or less, for example, about 500° C., 490° C., 480° C., 470° C., 460° C., 450° C., 440° C., 430° C., 420° C., 410° C., 400° C., 375° C., 350° C., 325° C., or 300° C. or less.

Stations

As used herein, "station" refers broadly to a location that can contain a substrate so that a deposition reaction can be performed on the substrate in the station. A station can thus refer to a reactor, or a portion or a reactor, or a reaction space or reaction chamber within a reactor.

Preferably, stations in accordance with embodiments herein are in "gas isolation" from each other, or are configured to be in gas isolation while a substrate is processed inside the station. As used herein, "gas isolation" means that a first reactant in a first station cannot detectably flow or diffuse to another station, and moreover that other reactants (e.g. from other stations) cannot detectably flow or diffuse into the first station. Stations in accordance with embodiments herein can be permanently in gas isolation from each other (for example, separated by solid walls, or as discrete chambers), or can be reversibly in gas isolation from each other (for example, by positioning solid barriers or gas bearings or gas curtains (e.g. inert gas curtains such as $N_2$ curtains) after a substrate is positioned in a given station, or just prior to placing a substrate in a given station, so that the solid barriers or gas bearings or gas curtains place the substrate in gas isolation). In some embodiments, the stations are in gas isolation by way of physical barriers but not gas bearings or gas curtains. In some embodiments, the stations are in gas isolation by way of physical barriers in conjunction with gas bearings and gas curtains. In some embodiments, after or concurrently with the placement of a substrate in a particular station, that substrate is placed in gas isolation from the other stations (so that process steps can be performed in that station), and after the substrate has been exposed to reactant in the station, the station is brought out of gas isolation, and the substrate can be removed from the station and positioned in an intermediate space. Substrates from multiple different stations can be placed in a shared intermediate space for movement from station to station. The stations can be placed in gas isolation, for example, by a physical barrier.

In some embodiments, the stations are separated from each other by solid materials, and are not separated from each other by gas bearings or gas curtains. In some embodiments, the stations are separated from each other by solid materials or gas curtains, and are not separated from each other by gas bearings. In some embodiments, the stations are separated from each other by solid materials or gas bearings, and are not separated from each other by gas curtains. Optionally, the physical barrier can move in conjunction with a moving stage that shuttles substrates between the stations and the intermediate space, so that the physical barrier places the station in gas isolation at the same time (or slightly before or slightly after) the substrate is placed in that station. Optionally the physical barrier can be used in conjunction with a gas barrier, for example to fill some gaps left by the physical barrier. In some embodiments, a physical barrier is provided, but a gas barrier or gas curtain does not.

In some embodiments, a station comprises a module or chamber of a reactor, so that each station comprises a separate chamber or module. In some embodiments, a station comprises a portion of a reaction chamber which can be placed in gas isolation from other portions of the reaction chamber by positioning a wall, a gas curtain or a gas bearing between the stations. Optionally, a given station is completely enclosed by one or more walls, gas curtains, gas bearings, or a combination of any of these items. It is contemplated that physical separation between two stations that provide different reactants can further facilitate gas isolation in accordance with some embodiments herein. Accordingly, in some embodiments, a first station that provides a first reactant is not immediately adjacent to a second station that provides a second reactant, but rather physical space is maintained between the first and second station, as well as optional features such as walls or gas walls or gas bearings and/or intervening chambers. In some embodiments, scavengers (for example secondary precursor scavengers in gas communication with a vacuum) are positioned between stations to scavenge any precursor that has escaped from stations and/or been dragged along with the substrate.

In accordance with some embodiments herein, a station for deposition is in gas communication with a reactant source, so that a reactant can be flowed into the station. Typically, stations for deposition (e.g. ALD) in accordance with various embodiments herein will provide only one reactant each (e.g. a first station can provide only one reactant for a first half reaction, and a second station can provide only one, different reactant for a second, different half reaction so as to complete the ALD reaction). Accordingly, for ALD, a first station can provide a first reactant, and second station can provide a second reactant that is different from the first reactant. The second reactant can react with a layer (typically no more than a monolayer) obtained from the adsorption of the first reactant contacted with the substrate at the first station. It is noted a number of first and second gas and/or plasma reactants, if contacted with each other, can result in undesired chemical vapor deposition (CVD)-type reactions, which can yield undesired deposits on surfaces of the reactor and/or substrate. Selective ALD processes are particularly sensitive to loss of selectivity and/or reduction in film quality due to CVD reactions. Furthermore, ALD processes that involve more than two reactants, for example dual selective ALD (which can involve 4, 6, or more reactants) are especially susceptible to loss of selectivity and/or reduction in film quality due to CVD reactions between the various reactants. Accordingly, it is contemplated that in accordance with some embodiments herein, physical and/or temporal separation between different reactants is provided so as to avoid undesired CVD-type reactions. Preferably, a first station provides a first reactant but not a second reactant, and a second station provides a second reactant but not a first reactant. The first and second stations can be in gas isolation from each other. As such, the second reactant can be substantially or completely absent from the first station, and the first reactant can be substantially or completely absent from the second station, which can minimize or eliminate undesired CVD-type reactions between the first and second reactants. It is noted that not just any multi-station ALD reactor will provide gas isolation between stations. For example, a number of conventional multi-station ALD reactors can involve incomplete or a lack of separation between reactants, for example by providing multiple reactants at the same station, or by rapidly moving a substrate between stations while allowing "trailing" reactants to travel with the substrate and react with other reactants. Moreover, a conventional emphasis on increasing throughput alone can exacerbate the possibility of undesirable CVD-type, or other undesired reactions, for example by rapidly moving a substrate away from a station while concentrations of reactants are high (and bringing a relatively high concentration of "trailing" reactant to the next station). It is contemplated in accordance with some embodiments herein that relatively low throughput is acceptable in order to obtain process advantages such as highly selective deposition, high film quality, and/or an absence of deposits on reactors.

In some embodiments, a station is configured for thermal ALD. In some embodiments, a station is configured for PEALD. Optionally, the plasma can be generated by a remote plasma generator, or can be generated in situ.

In some embodiments, a reactant in a station is delivered via a showerhead. Optionally, the showerhead comprises a vacuum exhaust scavenger around its perimeter to capture excess reactant, and to minimize the amount of reactant that is potentially available to participate in CVD reactions with other reactants. In some embodiments, reactants are contained within stations (and/or reactant source lines and/or purge lines), but are not permitted to enter any spaces between the stations.

It is noted that for some indexed multi-station processes (e.g. processes in which a substrate is moved between multiple stations), the station with the slowest process time is rate-limiting. That is, if a first station requires 3 seconds to deposit and purge, no more than one substrate can be cycled through the stations every three seconds, even if the other stations require less than three seconds to provide and purge the reactant. This can result in a slower process and/or can waste reactants if the reactants are constantly supplied in stations that require shorter exposure times to the substrate. In some embodiments, reactants are not constantly provided in each station, but rather exposure time in each station is selected based on the specific reaction occurring in that station. Thus, if a first reactant at a first station requires a shorter exposure time than a second reactant at a second station, the flow of the first reactant can be cut-off in the first station after a sufficient deposition time for the first reactant, even if the second reactant is still being provided in the second station. Optionally, excess reactant is recovered. For example, if reactant #1 is contacted with a substrate at station #1 for 1 second, and reactant #2 is contacted with a substrate at station #2 for 3 seconds, after the substrate is contacted with reactant #1 at station #1 for 1 second a vacuum can recover excess reactant #1 while the contacting continues at station #2. It is noted that reactant #1 can be flowed continuously, or the flow of reactant #1 can be shut-off after the contacting. Optionally, a reactant is provided via a showerhead or showerhead-like distributor, which further comprises a vacuum around its perimeter. After a sufficient time for the reactant to be deposited, the vacuum recovers any excess reactant. Optionally showerhead or showerhead-like distributors can be configured to flow reactant from the center to the edge of the substrate. It is contemplated that such an arrangement of reactant flow can minimize or eliminate edge effects, which can be characteristic of cross-flow designs.

In accordance with some embodiments herein, a substrate is shuffled between two or more stations, in which no two stations provide the same reactant. For example, a first station can provide a first reactant that is selectively adsorbed onto a first exposed surface of the substrate (relative to a second, different exposed surface of the substrate on which no or substantially no adsorption takes place) to form no more than a monolayer on the first exposed surface, a second station can provide a second reactant that is different from the first reactant, and reacts with the adsorbed first reactant so that no more than a monolayer of the second reactant is adsorbed over the first exposed surface of the substrate (but does not react with the second, different exposed surface of the substrate). The substrate can be repeatedly shuffled back and forth between the first and second stations until a film of desired thickness is formed. In some embodiments, the substrate moves continuously between stations. However, it is contemplated that continuous movement can result in the intermixing of different reactants (for example if a substrate holder continuously moves between station 1 and station 2, some reactant from station 1 can remain associated with the substrate holder and be "dragged along" to station 2), which can result in undesired CVD reactions between the different reactants. On the other hand, stop-start motion involving pauses or near pauses while the substrate is in a station and quick motion between stations, for example indexing, can minimize the time in which a substrate is outside of a station (and thus can minimize potential exposure to reactants that have escaped from other stations) and/or can facilitate purging a given station before the substrate exits the station. Accordingly, in some embodiments, the motion of the substrate between stations is not continuous, but rather comprises an indexing motion, such as a stop-start, or alternating slow-fast motions.

Examples of approaches for moving substrates from station to station and corresponding process steps in accordance with some embodiments herein, are illustrated schematically in FIGS. 3-6, and described in more detail below.

In some embodiments, the substrate is moved from one station to the next station in the process sequence (e.g. movement time between the first station and the second station, and not necessarily including time in the station) in less than 1000 milliseconds (msec), for example less than 1000 msec, 900, 800, 700, 600, 500, 400, 300, 200, 175, 150, 125, 100, 75, 50, 25, 10, or 5 msec, including ranges between any two of the listed values, for example 10-1000 msec, 10-500 msec, 10-400 msec, 10-300 msec, 10-200 msec, 10-100 msec, 30-1000 msec, 30-500 msec, 30-400 msec, 30-300 msec, 30-200 msec, 30-100 msec, 50-1000 msec, 50-500 msec, 50-400 msec, 50-300 msec, 50-200 msec, 50-100 msec, 100-1000 msec, 100-500 msec, 100-400 sec, 100-300 msec or 100-200 msec. Optionally, the substrate can be shuffled between two or more stations that are separated by solid materials such as walls, rather than gas bearings or gas curtains. Optionally, the substrate is shuffled between stations along a circular path or arc rather than a linear path. Optionally, the substrate is shuffled between stations along a linear path rather than an arc or circular path. It is also contemplated that moving a substrate from station-to-station without passing through any additional locations in accordance with some embodiments herein can increase throughput by minimizing handling time. Optionally, the substrate is moved directly from a first station to a second station without passing through an additional location.

It is further contemplated that in accordance with some embodiments herein, minimizing physical structures that pass from station to station can facilitate gas isolation between the different stations. For example, providing a susceptor in each station rather than moving a susceptor between stations can minimize residual reactants that trail along with the susceptor, and further can minimize CVD-type deposits on the susceptor itself. For example, only moving the substrate into stations from which reactants are absent can minimize undesired CVD-type deposited on the susceptor itself. In some embodiments, the substrate is moved from station to station, and placed on a stationary susceptor at each station. As such, the substrate is not placed on any susceptor that moves between stations. In some embodiments, no susceptor moves from station-to-station. For example, a rotating plate wafer holder (e.g. a "lazy Susan" configuration) has the potential to bring "trailing," residual reactants from station-to-station. Further, conventional "plate" wafer holders for holding a plurality of plates, and/or rotating the plate to transfer the wafers from station to station, and/or exposing the wafers to reactants while the wafers remain supported on the plate, have the disadvantage that a surface adjacent to the wafer travels from station to station. As such, deposition (ALD and/or CVD) can occur on the surface of the plate, which is undesirable. Accordingly, in some embodiments, the substrate is not placed on a rotating wafer holder. In some embodiments, the ALD reactor does not comprise a rotating wafer holder. In some embodiments, the substrate is placed only on stationary substrate holders. In some embodiments, each station comprises at least one wafer holder that is contained within the station, and does not move outside of the station. In some embodiments, a transfer member places the substrate on a susceptor in a station, or on a wafer holder in a station. In some embodiments, no surface of the reactor is exposed to more than one reactant. As such, in some embodiments, no surface is substantially contacted with more than one reactant.

Preferably, after the substrate is placed on a susceptor in a station by the transfer member, the transfer member retracts from the station so that the transfer member is not contacted with any reactants.

In accordance with some embodiments herein, the wafer surfaces are the only surfaces that are repeatedly and sequentially contacted to two or more reactants (i.e. other surfaces such as susceptors, transfer members, chamber surfaces, gas source conduits, and/or discharge conduits are not contacted with two or more different reactants). The contacting with different reactants, in accordance with various embodiments herein, can occur in different stations. Accordingly, all inner surfaces of a station, including wall surfaces, susceptor surfaces, gas conduit and discharge conduit surfaces in direct communication with the inner space of a station and any other reactor parts present in the interior of a station are substantially contacted with no more than one reactant.

It is noted that the inner surfaces of a station can be contacted with one or more inert gases (e.g. a carrier gas and/or purge gas) in addition to a reactant gas. Any wafer transfer member for transferring a wafer from one station to another station and moving from one station to another station will not be present in the station during contacting the wafer with a reactant and, therefore, will not be contacted with a reactant.

Optionally, the substrate can remain stationary while being exposed to reactant in each station. In some embodiments, the substrate is moved between two or more stations via a rotating wafer support system. The substrate can be placed on a wafer support, for example a paddle, which can be rotated so as to move the substrate between stations. Optionally, after a substrate is contacted with a reactant in a station, a purge is applied to the rotating wafer support before it rotates the substrate to a subsequent station. In some embodiments, the substrate is moved between two or more stations via a spider, for example a spider as described herein. In some embodiments, the substrate is transported on an end effector from one station to another.

It is noted that if two different stations comprise two different reactants, different reaction conditions, for example different pressures and/or temperatures can be maintained in the different stations. For example, a first station can be at a first temperature and pressure optimized for a first reactant at the first station, and a second station can be at a second temperature and pressure optimized for a second reactant at the second station. As such, in some embodiments, the first station is at a different temperature than the second station. In some embodiments, the first station is at a different pressure than the second station. In some embodiments, the first station is at a different temperature and pressure than the second station. In some embodiments, the first station is at a different temperature than the second station, but the two stations are at the same pressure. In some embodiments, the first station is at the same temperature as the second station, but the two stations are at the different pressures.

Optionally, a station is further in gas communication with a purge gas source and/or a vacuum, so that the station can be purged. For example, in accordance with some embodiments herein, after a substrate is contacted with a reactant at a first station (but before the substrate is moved to a second station), the station can be purged while the substrate remains in the first station so as to minimize or eliminate the possibility of an lingering reactant being transported to the second station along with the wafer. It is contemplated reactant trailing on the substrate as it is moved to the next station can result in undesired CVD-type reactions with a different reactant at that next station, and as such, in accordance with some embodiments herein, purging can facilitation separation between different reactants, and this minimize such undesired CVD-type reactions.

Optionally, a "purge location" can be in gas communication with a purge gas and/or a vacuum, but does not supply reactant to a substrate. It is contemplated that after being contact with a first reactant in a first station, a substrate can be placed in a purge location. A purge can be performed while the substrate is in the purge location so as to remove any lingering first reactant from the substrate. After the purge, the substrate can be placed in a second station that provides a second reactant to the substrate. Optionally a purge location is in gas isolation from each of the stations that provides reactant. It is noted that purge locations can be compatible with purging a reaction station itself. For example, after the substrate is contacted with a reactant in a station (and while the substrate is still inside the station), a purge gas can be provided to the station so as to purge the station, and the substrate can then be placed in a purge location for an additional purge. For example, after the substrate is contacted with a reactant in a station (and while the substrate is still inside the station), the substrate can be placed in a purge location for an additional purge, and the station itself can be purged while the substrate is being purged in the purge location (the purge of the station can begin before, while, or after the substrate is removed). In some embodiments, the intermediate space (outside of the stations) comprises the purge location, or the intermediate space consists or consists essentially of the purge location.

For some ALD processes, some reactants under some sets of reactant conditions (e.g. temperature, pressure, amount of reactant) can make a reactant difficult to purge from a chamber or station. It is contemplated that methods and apparatuses in accordance with some embodiments herein can address "difficult to purge" reactants and conditions. For example, if a particular reactant under a particular set of reaction conditions is difficult to purge at a certain station, the substrate can be removed from the station while the station continues to be purged before another substrate is placed in the station. Optionally, the substrate can be moved to a purge station to remove any remaining trailing reactant, while the "difficult-to-purge" reactant continues to be purges from its station.

It is contemplated that if two reactants that react with each other are both present in the same purge location or purge line, the reactants can leave undesired CVD deposits on the purge location and/or in the purge line. Accordingly, in some embodiments, different stations are in gas communication with different purge lines, so that a first reactant does not contact a second reactant in the purge line. For example, the station(s) that provide a first reactant can be in gas communication with a first purge line, and the station(s) that provide a second reactant can be in gas communication with a second purge line that is different from the first purge line. Accordingly, in some embodiments, different purge locations are associated with purging different reactants. For example, a first purge location can be positioned downstream (in a process flow) from a first station that provides a first reactant, and a second purge location can be positioned downstream (in a process flow) from a second station that provides a second reactant, so that the first reactant and second reactant are not purged at the same purge location.

Optionally, for example in the context of dual selective ALD (described, for example, in U.S. application Ser. No. 14/687,833 filed Apr. 15, 2015, which is incorporated by reference in its entirety herein), a third station further provides a third reactant (different from the first and second reactants) that is selectively adsorbed onto the second exposed surface of the substrate to form no more than a monolayer relative to the first exposed surface (or the film deposited on the first exposed surface). Furthermore, a fourth station further provides a fourth reactant (different from the third reactant) that reacts with the third reactant adsorbed on the second surface so that no more than a monolayer of the fourth reactant is adsorbed on the second surface. Each of the first, second, third, and fourth stations can be in gas isolation from each other, either continuously, or temporarily (such as when a substrate is positioned inside each station).

Optionally, one or more stations in accordance with some embodiments herein comprise a susceptor on which a substrate can be placed. The susceptor can be heated, and thus can be configured to heat a substrate to a suitable temperature. It is noted that different reactants can react at different temperatures. Accordingly, in some embodiments, the susceptor can heat the substrate for different durations so as to allow the substrate to reach the appropriate temperature.

Optionally, the susceptor can have a lower mass than the substrate, so that the susceptor can be heated more rapidly than the substrate. Optionally, the susceptor does not move from station to station.

In some embodiments, an ALD reactor comprises at least 2 stations, for example at least 2, 3, 4, 5, 6, 7, 8, 9, 10, 11, 12, 13, 14, 15, 16, 17, 18, 19, 20, 30, 40, 50, 100, 150, 200, 250, 300, 400, or 500 stations, including ranges between any two of the listed values. It is contemplated that in order to minimize undesired CVD reactions by maintaining separation between different reactants in accordance with some embodiments herein, it can be useful for a reactor to have at least twice as many stations as substrates. For example, the reactor can be configured for a ratio of less than or equal to 0.5 substrates per station, for example 0.5, 0.4, 0.3, 0.2, 0.1, or 0.05 substrates per station, including ranges between any two of the listed values.

Methods of ALD

In accordance with some embodiments herein, methods of atomic layer deposition (ALD) are provided. The method can comprise providing a substrate having an exposed surface. The method can comprise contacting the entire substrate with a first reactant at a first station so that no more than one monolayer of the first reactant is adsorbed on the exposed surface. The method can comprise placing the substrate in a second station, and contacting the entire substrate with a second reactant in the substantial absence of the first reactant at the second station, so that no more than one monolayer of the second reactant is adsorbed on the exposed surface that adsorbed the first reactant. Optionally, the substrate is placed in the first station and the second station by a transfer system, wherein no surface of the transfer system is substantially in the presence of more than one reactant. Optionally, the method is repeated until a film of desired thickness is deposited over the exposed surface. Optionally, other than the substrate itself, no other surfaces are contacted with both the first and second reactant (e.g. surfaces of the first and second station, gas source lines, purge lines, susceptors, and/or substrate transfer members, if present, are not contacted with both the first and second reactant). Optionally, the ALD comprises selective ALD. Optionally, the ALD comprises dual selective ALD. In some embodiments, no surface of any station, substrate transfer member, and/or purge line is substantially contacted with more than one reactant. As such, no surface within a station (other than the substrate itself, if present) is substantially contacted with more than one reactant.

In some embodiments, the method comprises selective ALD. The method can comprise providing a substrate comprising two different exposed surfaces (e.g. different compositions and/or different morphologies or crystallinities). The method can comprise contacting the entire substrate with a first reactant at a first station so that no more than one monolayer of the first reactant is adsorbed on a first exposed surface preferentially to a second, different exposed surface of the substrate. The method can comprise placing the substrate in a second station, and contacting the entire substrate with a second reactant in the substantial absence of the first reactant at the second station, so that no more than one monolayer of the second reactant is adsorbed on the first exposed surface that adsorbed the first reactant. Optionally, the method is repeated until a film of desired thickness is selectively deposited over the first exposed surface (relative to the second exposed surface). In accordance with the method, no adsorption of the first reactant occurs on the second exposed surface. Optionally, the method comprises dual selective ALD. Optionally, other than the surfaces of the substrate itself, no other surfaces are contacted with both the first and second reactant (e.g. surfaces of the first and second station, gas source lines, purge lines, susceptors, and/or substrate transfer members, if present, are not contacted with both the first and second reactant).

Without being limited by any theory, it is contemplated that CVD reactions can interfere with ALD, and especially selective ALD or dual selective, for example by decreasing or eliminating selectivity. Additionally, undesired CVD reactions can reduce the quality of the deposited film, and/or leave undesired deposits on the reactor, necessitating additional cleaning processes and/or damaging the reactor. It is contemplated that selective ALD processes in accordance with some embodiments herein minimize and/or eliminate CVD reactions, thereby yielding highly selective deposition, high film quality, and moreover preventing any deposition on the reactor surfaces and extending the operational life of the reactor. Accordingly, in some embodiments, physical and optionally temporal separation is maintained between ALD reactants. In some embodiments, no two different reactants are present in the same location at any time during an ALD deposition process. By way of example, the substrate can be moved to different stations, each of which is in gas isolation from the other stations and provides a different reactant to the substrate. Additionally, residual reactants can be removed from the substrate before it is placed in a subsequent station to minimize undesirable CVD reactants that would involve residual reactants that follow the substrate to the subsequent station.

FIG. 1A is a flow diagram illustrating a method of ALD in accordance with some embodiments herein. The method can comprise providing a first substrate 105. The method can comprise (a) placing the first substrate in a first station 115. The first substrate can be placed in the first station by a number of approaches, for example a substrate transfer system comprising a transfer member such as a rotating substrate holder or a spider. Optionally, the transfer member places the substrate on a stage or susceptor, and one or more moveable barriers defining the first station are positioned to dispose the substrate in the first station in gas isolation. The substrate can be placed on extended lift pins, which can be lowered to position the substrate on the appropriate surface of the stage or susceptor. Optionally, the transfer member places the substrate on a first substrate transfer mechanism (e.g. a moveable stage) in an intermediate space, and the first substrate transfer mechanism moves the substrate into the first station. Optionally, each substrate transfer mechanism comprises a plurality of lift pins configured to extend and lift the substrate from the substrate transfer mechanism in the intermediate space, or to retract to position the substrate on the appropriate surface. The lifted substrate can be readily picked up by a substrate transfer member such as a spider to move the substrate to a different substrate transfer mechanism in the intermediate space. Optionally, the substrate transfer member is retracted into the intermediate space after placing the substrate on a stage or susceptor in the first station, or after placing the substrate on the first substrate transfer mechanism. Optionally, the first station can be placed in gas isolation 125, for example in gas isolation from any other stations in which reactants are provided (e.g. the second station as described herein). The first station can be placed in gas isolation concurrently with, or after the substrate has been placed in the first station. Alternatively the first station can be in gas isolation at the time the substrate is placed in the first station. In some embodiments, the first station is continuously in gas isolation from a second station. The method can comprise (b) contacting the first substrate in the first station with a first reactant substantially in the absence of a second reactant and while the first station is in gas isolation from a second station, and wherein the first reactant reacts with a surface of the substrate such that no more than one monolayer of the first reactant is adsorbed on a surface of the first substrate 135. The first reactant can be flowed into the first station after the first substrate is placed in the first station, or the first reactant can be already present in the first station when the first substrate is placed in the first station. Optionally, the first reactant is not present in the first station at the time the substrate is placed in the first station. Optionally, after being exposed to the first reactant in the first station, and prior to being placed in a second station, the first substrate can be exposed to a purge, in the first station, and/or in a purge location that is different from the first station (for example, a purge location in an intermediate space). The method can comprise (c) placing the first substrate in a second station 145. Optionally, one or more moveable barriers defining the first station are moved to expose the substrate to an intermediate space. The lift pins, if present, can be extended to make the substrate accessible to the transfer member. The transfer member (e.g. rotating substrate holder or spider) can pick up the substrate and place the substrate on a second stage or susceptor. The substrate can be placed on extended lift pins, which can retract to position the substrate on the appropriate surface. One or more moveable barriers defining the second station can be moved to dispose the substrate in the second station in gas isolation. Optionally, placing the first substrate in the second station comprises moving the substrate to an intermediate space via a first substrate transfer mechanism, such as a moveable stage, and then, within the intermediate space, moving the substrate to a second substrate transfer mechanism (such as a second movable stage) in the intermediate space, which can place the substrate in the second station. Optionally, the substrate can be moved from the first substrate transfer mechanism in the intermediate space to the second substrate transfer mechanism in the intermediate space via the substrate transfer member (e.g. spider or rotating substrate holder). Optionally, the substrate transfer member is retracted into the intermediate space after placing the substrate on a stage or susceptor in the second, or after placing the substrate on the second substrate transfer mechanism. Optionally, the second station can be placed in gas isolation from the first station 155, for example the second station can be placed in gas isolation from any other stations in which reactants are provided (e.g. the first station). The second station can be placed in gas isolation concurrently with, or after the substrate has been placed in the second station. Alternatively the second station can be in gas isolation at the time the substrate is placed in the first station. In some embodiments, the second station is continuously in gas isolation from the second station. The method can include (d) contacting the first substrate in the second station with the second reactant and substantially in the absence of the first reactant and while the second station is in gas isolation from the first station, and wherein the second reactant is different from the first reactant, and reacts with the no more than one monolayer of the first reactant, such that no more than one monolayer of the second reactant is adsorbed on the surface of the first substrate 165. The second reactant can be flowed into the second station after the first substrate is placed in the second station, or the second reactant can be already present in the second station when the first substrate is placed in the first station. Optionally, the second reactant is not present in the second station at the time the substrate is placed in the first station. Optionally, after being exposed to the second reactant in the second station, and prior to being placed in another station (for example the first station, or a third station), the first substrate can be exposed to a purge, either in the second station, and/or in a purge location that is different from the second station (for example a purge location in the intermediate space). The method can include repeating (a)-(d) wherein (b) is substantially in the absence of the second reactant, until a film of desired thickness is deposited on the surface of the first substrate 175. Optionally, other than the surfaces of the substrate itself, no other surfaces are contacted with both the first and second reactant 185 (e.g. surfaces of the first and second station, gas source lines, purge lines, substrate transfer members, susceptors, and/or substrate transfer mechanisms, if present, are not contacted with both the first and second reactant). The skilled artisan will appreciate that steps listed herein can be performed in a different order, eliminated, or duplicated in accordance with some embodiments.

Figure 1B:
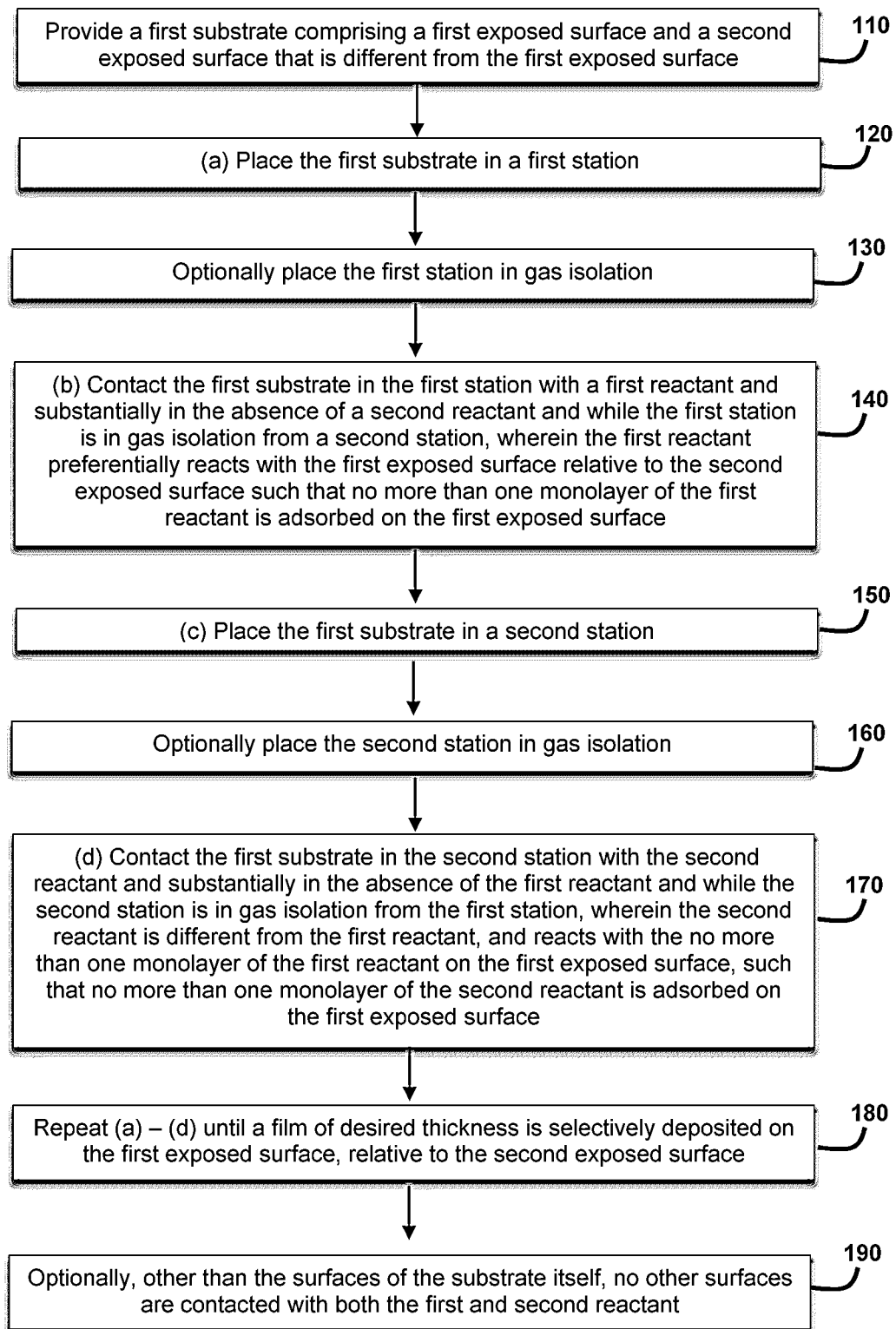
FIG. 1B is a flow diagram illustrating methods of selective Atomic Layer Deposition in accordance with some embodiments herein.

FIG. 1B is a flow diagram illustrating a method of selective ALD in accordance with some embodiments herein. The method can comprise providing a first substrate comprising a first exposed surface and a second exposed surface that is different from the first exposed surface 110. The method can comprise (a) placing the first substrate in a first station 120. The first substrate can be placed in the first station by a number of approaches, for example a substrate transfer system comprising a transfer member such as a rotating substrate holder or a spider. Optionally, the transfer member places the substrate on a stage or susceptor, and one or more moveable barriers defining the first station are positioned to dispose the substrate in a station in gas isolation. The substrate can be placed on lift pins, which can be lowered to position the substrate on the appropriate surface. Optionally, the transfer member places the substrate on a first substrate transfer mechanism (e.g. a moveable stage) in an intermediate space, and the first substrate transfer mechanism moves the substrate into the first station. Optionally, each substrate transfer mechanism comprises a plurality of lift pins configured to extend and lift the substrate from the substrate transfer mechanism in the intermediate space. The lifted substrate can be readily picked up by the transfer member (e.g. spider) to move the substrate to a different substrate transfer mechanism in the intermediate space. Optionally, the substrate transfer member is retracted into the intermediate space after placing the substrate on a stage or susceptor in the first station, or after placing the substrate on the first substrate transfer mechanism. Optionally, the first station can be placed in gas isolation 130, for example in gas isolation from any other stations in which reactants are provided (e.g. the second station as described herein). The first station can be placed in gas isolation concurrently with, or after the substrate has been placed in the first station. Alternatively the first station can be in gas isolation at the time the substrate is placed in the first station. In some embodiments, the first station is continuously in gas isolation from a second station. The method can comprise (b) contacting the first substrate in the first station with a first reactant and substantially in the absence of a second reactant and while the first station is in gas isolation from a second station, and wherein the first reactant preferentially reacts with the first exposed surface relative to the second exposed surface such that no more than one monolayer of the first reactant is adsorbed on the first exposed surface 140. The first reactant can be flowed into the first station after the first substrate is placed in the first station, or the first reactant can be already present in the first station when the first substrate is placed in the first station. Optionally, the first reactant is not present in the first station at the time the substrate is placed in the first station. Optionally, after being exposed to the first reactant in the first station, and prior to being placed in a second station, the first substrate can be exposed to a purge, in the first station, and/or in a purge location that is different from the first station (for example, a purge location in an intermediate space). The method can comprise (c) placing the first substrate in a second station 150. Optionally, one or more moveable barriers defining the first station are moved to expose the substrate to an intermediate space, and the transfer member (e.g. rotating substrate holder or spider) picks up the substrate and places the substrate on a second stage or susceptor. The substrate can be placed on lift pins, which can be lowered to position the substrate on the appropriate surface. One or more moveable barriers defining the second station can be moved to dispose the substrate in the second station in gas isolation. Optionally, placing the first substrate in the second station comprises moving the substrate to an intermediate space via a first substrate transfer mechanism, such as a moveable stage. The lift pins, if present, can be raised to make the substrate accessible to the transfer member. Then, within the intermediate space, the transfer member can move the substrate to a second substrate transfer mechanism (such as a second movable stage) in the intermediate space. The substrate can be placed on lift pins, which can be lowered to position the substrate on the appropriate surface. The transfer member can place the substrate in the second station. Optionally, the substrate can be moved from the first substrate transfer mechanism in the intermediate space to the second substrate transfer mechanism in the intermediate space via the transfer member (e.g. spider or rotating substrate holder). Optionally, the substrate transfer member is retracted into the intermediate space after placing the substrate on a stage or susceptor in the second station, or after placing the substrate on the second substrate transfer mechanism. Optionally, the second station can be placed in gas isolation 160, for example the second station can be placed in gas isolation from any other stations in which reactants are provided (e.g. the first station). The second station can be placed in gas isolation concurrently with, or after the substrate has been placed in the second station. Alternatively the second station can be in gas isolation at the time the substrate is placed in the first station. In some embodiments, the second station is continuously in gas isolation from the second station. The method can include (d) contacting the first substrate in the second station with the second reactant and substantially in the absence of the first reactant and while the first station is in gas isolation from the second station, wherein the second reactant is different from the first reactant, and reacts with the no more than one monolayer of the first reactant on the first exposed surface, such that no more than one monolayer of the second reactant is adsorbed on the first exposed surface 170. The second reactant can be flowed into the second station after the first substrate is placed in the second station, or the second reactant can be already present in the second station when the first substrate is placed in the first station. Optionally, the second reactant is not present in the second station at the time the substrate is placed in the first station. Optionally, after being exposed to the second reactant in the second station, and prior to being placed in another station (for example the first station, or a third station), the first substrate can be exposed to a purge, either in the second station, and/or in a purge location that is different from the second station. The method can include repeating (a)-(d) wherein (b) is substantially in the absence of the second reactant, until a film of desired thickness is selectively deposited on the first exposed surface relative to the second exposed surface 180. Optionally, other than the surfaces of the substrate itself, no other surfaces are contacted with both the first and second reactant 190 (e.g. surfaces of the first and second station, gas source lines, purge lines, substrate transfer members, susceptors, and/or substrate transfer mechanisms, if present, are not contacted with both the first and second reactant). The skilled artisan will appreciate that steps listed herein can be performed in a different order, eliminated, or duplicated in accordance with some embodiments.

In some embodiments, at least one process step involving one or more reactants that are difficult to purge or prone to CVD reactions is performed prior to placing the substrate in the first station in accordance with some embodiments herein. For example, the substrate is first placed in at least one preliminary station, and contacted with a preliminary reactant (or combination of reactants) that is difficult to purge and/or prone to CVD reactions. After the substrate is contacted with the preliminary reactant (or combination of reactants), the substrate is placed in the first station. For example, the substrate can undergo a preliminary passivation step or a preliminary CVD reaction in the preliminary station. Optionally, the substrate is subject to a purge (either in the preliminary station or in a purge location) after being contacted with the preliminary reactant (or combination of reactants) but prior to being placed in the first station.

In some embodiments, the substrate is not contacted with the first reactant at any location other than the first station, and the substrate is not contacted with the second reactant at any location other than the second station. As such, the first reactant is not provided at the second station and/or the second reactant is not provided at the first station. Optionally, each station provides no more than one type of reactant.

It is further contemplated that maintaining temporal separation between reactants can facilitate the maintenance of "gas isolation" in accordance with some embodiments herein, and as such, can minimize undesired CVD reactions. For example, if a first reactant is not flowed into the reactor at the same time as a second reactant, these reactants can be maintained in temporal gas isolation. For example, in embodiments in which gas walls or gas bearings maintain spatial gas isolation, temporal isolation can further facilitate gas isolation by minimizing or eliminating effects of trace amounts of gas that diffuse out of stations. For example, embodiments in which physical walls maintain gas isolation, temporal isolation can further minimize or eliminate diffusion or leakage of reactants into other stations. In some embodiments, gas isolation comprises temporal separation between two reactants. In some embodiments, gas isolation comprises physical and temporal separation between two reactants. In some embodiments, all of the reactants in the ALD process are physically separated. In some embodiments, all of the reactants in the ALD process are temporally separated. In some embodiments, all of the reactants in the ALD process are physically and temporally separated. It is noted that maintaining temporal separation between reactants may decrease throughput, but that in accordance with some embodiments herein, it is acceptable to decrease throughput so that process advantages such as high selectivity, high film quality and/or reactor longevity can be achieved.

In some embodiments, the first station is purged while the first substrate is present in the first station after contacting the first substrate with the first reactant. The second station can be purged while the first substrate is present therein after contacting the first substrate with the second reactant. Optionally, the first station and second station comprise separate purge lines as described herein so as to minimize possible undesired CVD reactions between the first and second reactants in the purge lines. It is contemplated that in accordance with some embodiments herein, if the first substrate is exposed to a purge in the station in which it was contacted with a reactant, after the purge, the first substrate can be placed directly in a subsequent station without being placed in an intermediate location such as a purge location and/or wafer handling chamber.

In some embodiments, after contacting the first substrate in the first station with the first reactant, the substrate is placed in the second station without being placed in an additional location. Examples of additional locations include purge locations, and other stations configured to deliver reactant. It is noted that a substrate may pass through three-dimensional space (for example an "intermediate space") while being moved from the first station to the second station, but so long as the three-dimensional space does not include a different station or purge location, the substrate will have been considered to have not been placed in an "additional location". As such, in some embodiments, after contacting the first substrate in the first station with the first reactant, the substrate is placed in the second station without being placed in an additional location, and as such the substrate is not contacted with any additional reactants after the first reactant and prior to the second reactant.

In some embodiments, the first substrate is purged in a first purge location after being contacted with the first reactant and before being placed in the second location. The first purge location can be a location that is not in gas communication with the first station. In some embodiments, the first substrate is purged in a second purge location after being contacted with the second reactant in the second location. The second purge location can be a location that is not in gas communication with the second station. In some embodiments, the second purge location is different from the first purge location. In some embodiments, the second purge location is the same as the first purge location.

As described herein, it can be desirable to minimize or eliminate chemical vapor deposition (CVD)-type reactions, which can leave undesired deposits on the reactor surface, and/or on the substrate. Accordingly, in some embodiments, substantially no CVD-type reactions occur on any surface of the first station, and wherein substantially no CVD-type reactions occur on any surface of the second station. As used herein "substantially no CVD-type" (including variations of this root term) means that no more than 0.1%, preferably no more than 0.01% of the reactions involving a reactant in excess in a reaction space are CVD-type reactions. In some embodiments, substantially no CVD-type reactions occur on any surface of the reactor. In some embodiments, substantially no CVD-type reactions occur on the substrate. In some embodiments, substantially no CVD-type reactions occur in the purge lines and/or purge locations. It is noted that if a substrate is contacted with a first reactant "substantially in the absence" of a second reactant (or vice-versa), even if the first and second reactants would engage in a CVD-type reaction with each other, there would be substantially no CVD-type reactions. Thus, as used herein, if a first reactant is "substantially in the absence" of a second reactant (or vice-versa), there is a molar ratio of the first reactant to the second reactant of at least 10,000:1, for example at least 10,000:1; 20,000:1; 30,000; 1, 40,000:1; 50,000:1; 75,000:1; 100,000:1; 150,000:1; 200,000:1, 250,000:1; 300,000:1; 400,000:1, 500,000:1; 600,000:1; 700,000:1; 800,000:1; 900,000:1; 1,000,000:1 or 1,000,000,000:1, including ranges between any two of the listed values. It is noted that "substantially in the absence" as used herein also encompasses a complete absence. That is, if a second reactant is completely absent, a reaction is performed "substantially in the absence" of the second reactant, but if the second reactant is substantially absent, it is not necessarily completely absent. As such, as used herein, the phrase "no surface is substantially contacted with more than one reactant" (and variants of this root phrase) means that each applicable surface (other than the wafer) is contacted with up to one reactant during the ALD process, but no more than an insubstantial amount of any other reactant, so that for any gas that contacts that surface, the molar ratio of any other reactant to total gas is less than 1:10,000, for example less than 1:10,000; 1:20,2000; 1:30,000; 1:40,000; 1:50,000; 1:75,000; 1:100,00; 1:150,000; 1:200,000; 1:250,000; 1:300:000; 1:400,000; 1:500,000; 1:600,000; 1:700,000; 1:800,000; 1:900,000; 1:1,000,000; or 1:1,000,000,000, including ranges between any two of the listed values. It is noted that the phrase "no surface is substantially contacted with more than one reactant" (and its variants) as used herein also encompass a surface being contacted no reactant, or being contacted with only one reactant.

It is contemplated that in accordance with some embodiments herein, that decreasing process throughput can be acceptable in order to minimize or eliminate undesired CVD reactions. However, it is also contemplated that in some embodiments, two wafers can effectively be swapped between the first and second stations so as to minimize or eliminate undesired CVD reactions, while making use of the first and second stations at the same time. Accordingly, in some embodiments, while the first substrate is not present in the first station, a second substrate can be placed in the first station, in which the second substrate comprises a third exposed surface and a fourth exposed surface that is different from the third exposed surface. The second substrate in the first station can be contacted with the first reactant (substantially in the absence of the second reactant), such that the first reactant preferentially reacts with the third exposed surface relative to the fourth exposed surface, such that no more than one monolayer of the first reactant is adsorbed on the third exposed surface. After contacting the second substrate in the first station with the first reactant, and after contacting the first substrate in the second station with the second reactant, the second substrate can be placed in the second station substantially in the absence of the first reactant and placing the first substrate in the first station substantially in the absence of the second reactant, thereby swapping the first substrate and second substrate. In some embodiments, the first reactant does not react with the fourth surface. In some embodiments, the reactor comprises multiple pairs of stations, and in each pair of stations, a pair of wafer is repeatedly swapped until a film of desired thickness is selectively deposited on each wafer.

In accordance with some embodiments herein, additional ALD reactions can be performed on the substrate, for example as part of a dual selective ALD process sequence. Without being limited by any theory, it is contemplated that the methods and apparatuses in accordance with various embodiments herein are very useful for dual selective ALD. As dual selective ALD typically involves more than two reactants (for example 4 or 6 reactants), it is contemplated that dual selective ALD can be especially susceptible to undesired CVD reactions between the different reactants. Accordingly, maintaining spatial and/or temporal separation between reactants in accordance with various embodiments herein can yield dual selective ALD with high selectivity, high-quality deposited films, and minimal to no deposits on the reactor. The additional ALD reactions can be performed in stations other than the first or second station. In some embodiments an additional non-selective ALD reaction is performed on the substrate. In some embodiments, the additional ALD reactions are selective and provide for dual selective ALD on two different surfaces of the substrate. In some embodiments, a first film of a desired thickness is selectively deposited on the first surface of the substrate by ALD, and a second, different film of desired thickness is selectively deposited on the second, different surface of the first substrate by ALD (the first and second films can be of the same thickness, or can be of different thicknesses). Optionally, the second film of desired thickness is deposited by shuffling the wafer between a third station that provides a third reactant and a fourth station that provides a fourth reactant, in which the third and fourth stations are in gas isolation from the first and second stations and each other, and in which the third and fourth reactants are selectively adsorbed on the second surface, thus providing dual selective ALD on the first substrate. In some embodiments, the method further comprises a second selective ALD process that deposits a second thin film on the second surface of the first substrate, but not on the first surface of the first substrate. For example, the method can comprise dual selective ALD.

In some embodiments, selective ALD reactions are performed on multiple substrates in parallel. In some embodiments, while repeating (a)-(d) as described above, a third substrate is placed in a third station. The third substrate can comprise a fifth exposed surface and sixth exposed surface that is different from the fifth exposed surface. The third substrate in the third station can be contacted with the first reactant substantially in the absence of the second reactant, wherein the third station is in gas isolation from the first station and second station (or is placed in gas isolation from the first and second stations concurrent with or after the substrate is placed in the third station), and wherein the first reactant reacts with the fifth exposed surface but not the sixth exposed surface, such that no more than one monolayer of the first reactant is adsorbed on the fifth exposed surface. After contacting the third substrate in the third station with the first reactant, the third substrate can be placed in a fourth station, in which the fourth station is in gas isolation from the first station, second station, and third station (or is placed in gas isolation from the first, second, and third stations concurrent with or after the substrate is placed in the fourth station). The third substrate in the fourth station can be contacted with the second reactant substantially in the absence of the first reactant, wherein the second reactant preferentially reacts with the no more than one monolayer of the first reactant on the fifth exposed surface relative to the sixth exposed surface, such that no more than one monolayer of the second reactant is adsorbed on the fifth exposed surface. Additionally, to achieve a selectively-deposited film of desired thickness, the method can comprise repeating contacting the third substrate in the third station with the first reactant substantially in the absence of the second reactant and contacting the third substrate in the fourth station with the second reactant substantially in the absence of the first reactant until a film of desired thickness is selectively deposited on the fifth surface but not the sixth surface.

A variety of approaches are suitable for providing gas isolation between the stations, for example the first and second station, in accordance with the methods and reactors herein. Moreover, it is noted that the stations can either be continuously in gas isolation, or can be placed in gas isolation after the substrate is placed in the station, but before precursor is provided into the station. In some embodiments, at least one solid material provides gas isolation between the first and second stations, for example a glass or ceramic or metal or polymer wall. In some embodiments, a gas bearing or gas curtain provides gas isolation between the first and second stations. In some embodiments, gas isolation between the first and second stations does not comprise either of a gas bearing or a gas curtain but entirely relies on material walls.

In some embodiments, the stations are in fixed locations relative to each other. In some embodiments, the first station is in a fixed location relative to the second station. In some embodiments, the substrate is not in motion while being contacted with reactant in a station (e.g. while being contacted with the first reactant in the first station and/or the second reactant in the second station.

A variety of approaches are suitable for moving the substrate from station to station in accordance with methods and reactors herein. In some embodiments, a rotating substrate holder (e.g. comprising a rotational paddle) is provided. Accordingly, in some embodiments, placing the first substrate in the second station comprises rotating a substrate holder that holds the first substrate, thereby placing the first substrate in the second station. In some embodiments, a spider is provided. Accordingly, in some embodiments, a spider places the first substrate in the first station, removes the first substrate from the first station, and places the first substrate in the second station. Optionally, the stations can be fixed relative to each other. In some embodiments, the first substrate is placed in a substrate holder at the first station, and wherein placing the first substrate in a second station is performed without moving the substrate holder. In some embodiments, both a rotating substrate holder and spider are provided.

Figure 2A:
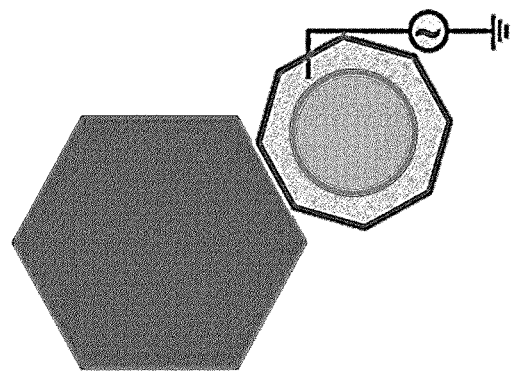
FIG. 2A is a diagram schematically illustrating a prior art reactor arrangement.
Figure 2B:
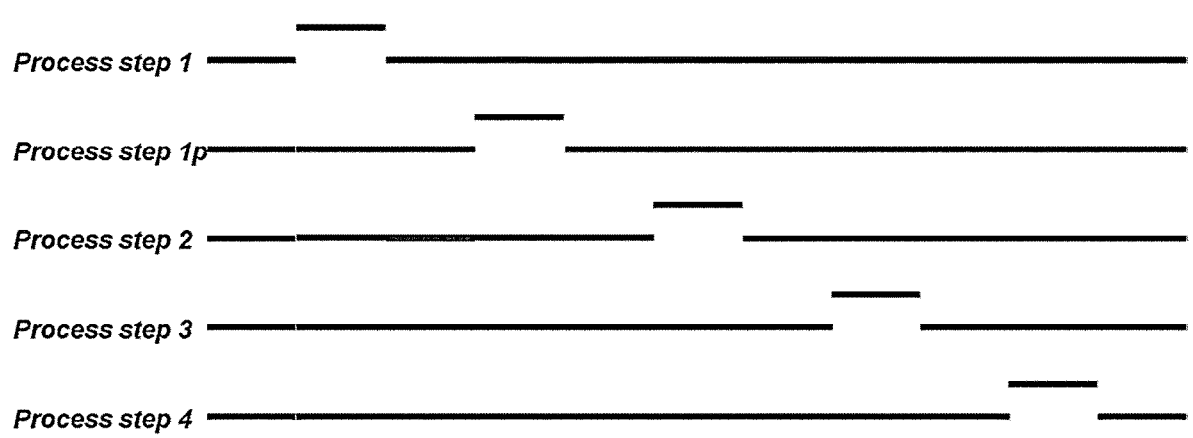
FIG. 2B is a diagram schematically illustrating a prior art process (which can be implemented in the reactor of FIG. 2A).
Figure 3A:
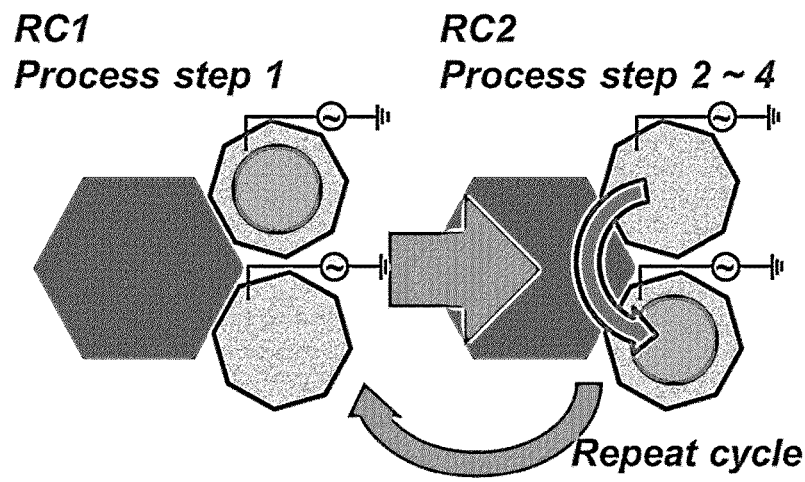
FIG. 3A is a diagram schematically illustrating a reactor and method for moving a substrate between stations in accordance with some embodiments herein.
Figure 3B:
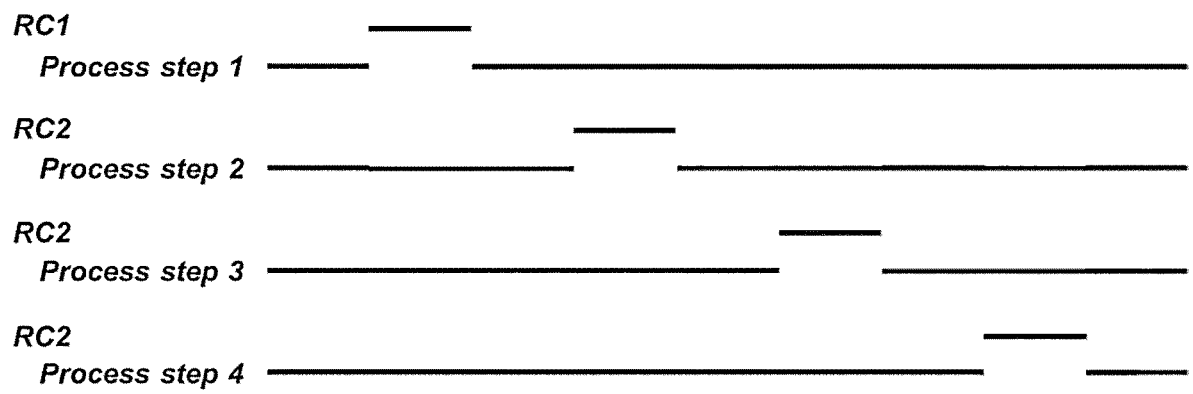
FIG. 3B is a diagram schematically illustrating process steps (which can be implemented in the reactor and method of FIG. 3A).

Examples of approaches for moving a substrate from station-to-station in accordance with some embodiments herein are illustrated schematically in FIGS. 3-6. As illustrated schematically in FIGS. 2A-2B, prior art approaches for deposition involving a single chamber (see FIG. 2A) could involve multiple process steps in the same chamber (see FIG. 2B). As such, residual reactants from different process steps could react with each other, resulting in undesirable CVD reactions. As illustrated schematically in FIG. 3A, in accordance with some embodiments herein, a substrate can be moved from one chamber to another in accordance with some embodiments herein (corresponding process steps are illustrated schematically in FIG. 3B). For example a first process step can be performed in a first station, and a second process step can be performed in a second station. If the first process step involves a reactant that is difficult to purge, and/or is particularly reactive with the reactants of the later process steps, spatial isolation between the first process step and subsequent process steps in accordance with some embodiments herein can reduce reactions involving the first reactant.

Figure 4A:
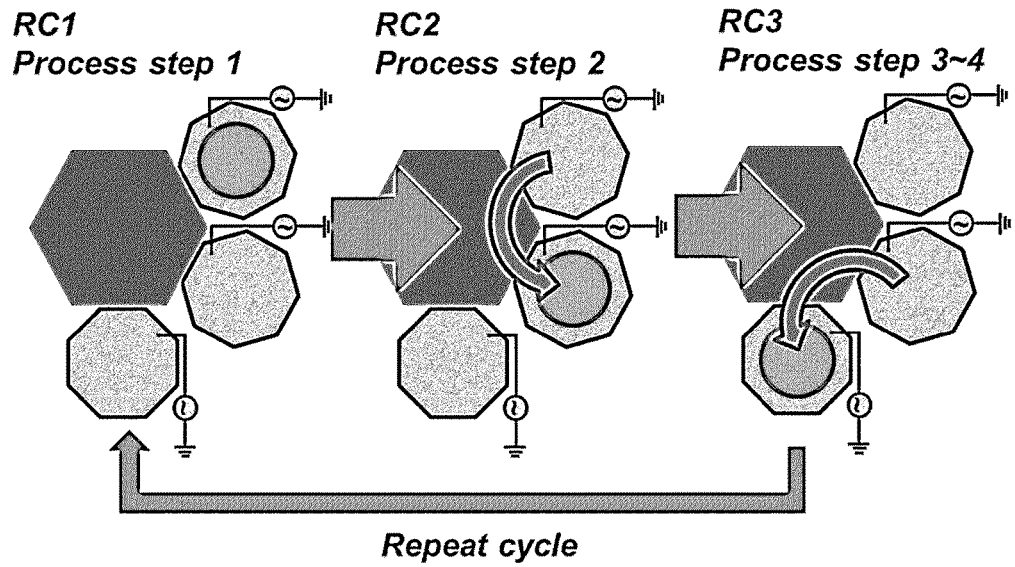
FIG. 4A is a diagram schematically illustrating a reactor and method for moving a substrate between stations, which can optionally be repeated in accordance with some embodiments herein.
Figure 4B:
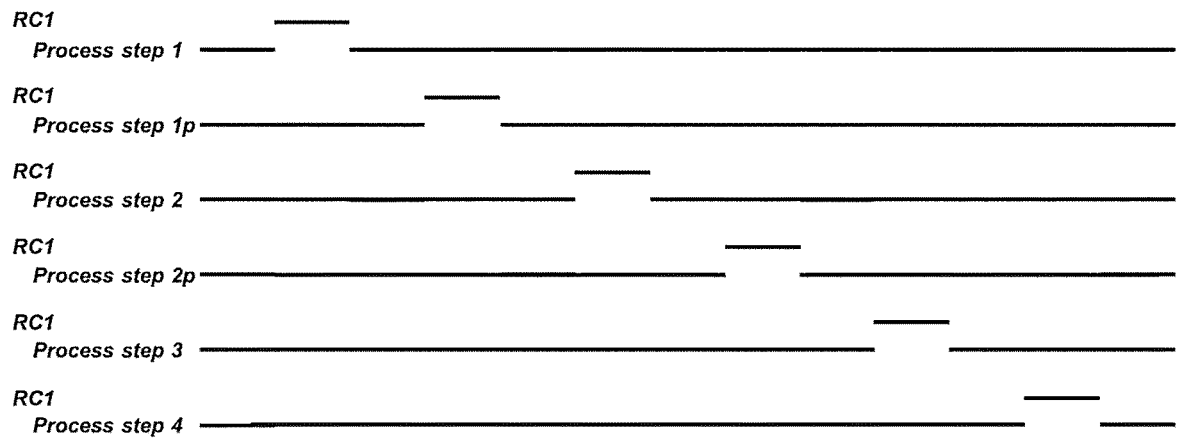
FIG. 4B is a diagram schematically illustrating a prior art process.
Figure 4C:
FIG. 4C is a diagram schematically illustrating process steps (which can be implemented in the reactor and method of FIG. 4A).
Figure 4C:
Figure 4C:
Figure 4C:

As illustrated schematically in FIG. 4A, in accordance with some embodiments herein, a substrate can undergo two or more process steps in separate stations (e.g. undergo a first process step in a first station "RC1", and then be placed in a second station "RC2" for a second process step), and then be placed to a third station "RC3". Corresponding process steps are illustrated schematically in FIG. 4C. It is noted that prior art approaches involving a single chamber ("RC1") would typically involve alternatingly and sequentially applying pulses of reactant (e.g. steps 1, 2, 3, and 4) and performing corresponding purge steps in the chamber (e.g. steps 1p, 2p, 3p)(see FIG. 4B). It is noted that depending on the efficiency of the purge, the prior art approach could still result in CVD reactions between residual reactant and a subsequent, different reactant. In accordance with some embodiments herein, a substrate is moved to different stations for different reactions, so that some or all of the purge does not add to the processing time. For example as illustrated in FIG. 4C, a substrate can be exposed to four different process steps in stations 1, 2 and 3 ("RC1", "RC2", and "RC3", respectively). In some embodiments, a station can be purged after the substrate is exposed to the process step. Physical separation between reactants can be accomplished by maintaining the stations in gas isolation. Optionally, the substrate can be purged at each station, or in a separate purge location so as to further minimize CVD reactions between different reactants. Optionally, the purge can be continued while or after the substrate is removed from the station. It is noted that the combination of purging and maintaining spatial separation between reactants need not substantially increase process time compared to the approach indicated in FIG. 4B, but can yield substantially higher selectivity and film quality, while minimizing or eliminating CVD deposits on the reactor. In some embodiments, reactants are flowed continuously in each station, and after the substrate is removed from a station, it is placed in a purge location and exposed to inert gas so as to substantially remove any trailing reactant from the station. In the example shown in FIG. 4, the stations are connected to a central wafer handling chamber and the wafers are transferred from station to station via the central wafer handling chamber.

Figure 5:
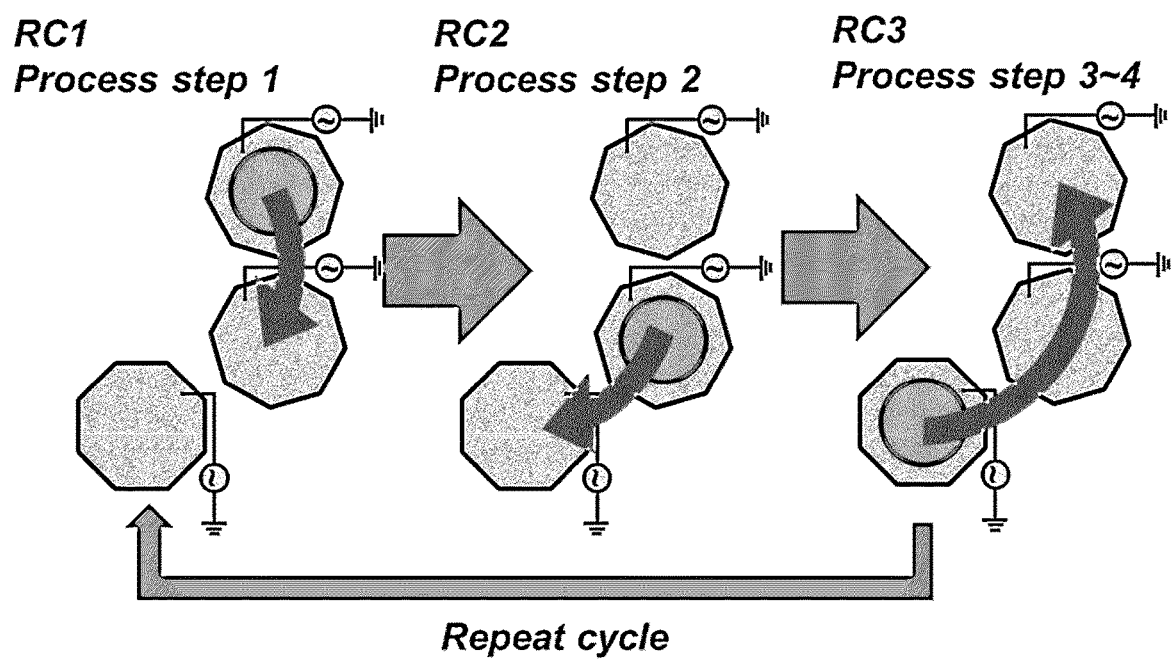
FIG. 5 is a diagram schematically illustrating a reactor and method for moving a substrate between stations, which can optionally be repeated in accordance with some embodiments herein.

As illustrated schematically in FIG. 5, in accordance with some embodiments herein, a substrate can repeatedly be shuffled between three or more stations ("RC1", "RC2", "RC3"), and a different process step can occur in each of the stations, for example in the context of dual selective ALD. For example, a substrate can be placed in station 1 ("RC1") for a first process step in which a first reactant is contacted with the substrate, can be placed in station 2 ("RC2") for a second process step in which a second reactant is contacted with the substrate, and placed in station 3 ("RC3") for at least a third process step. Optionally, the process can be repeated until a film of desired thickness is deposited on a desired surface of the substrate. In the example of FIG. 5, the stations are not connected to a central wafer handling chamber and the wafers are transferred directly from one station to an adjacent other station. The stations can be positioned in separate reaction chambers that are separated by isolation valves that can be opened to facilitate wafer transfer. The chambers can be arranged adjacent to each in a circular configuration, so that the last chamber (RC3) is adjacent to the first chamber (RC1) and the wafers can be moved in a loop.

Figure 6:
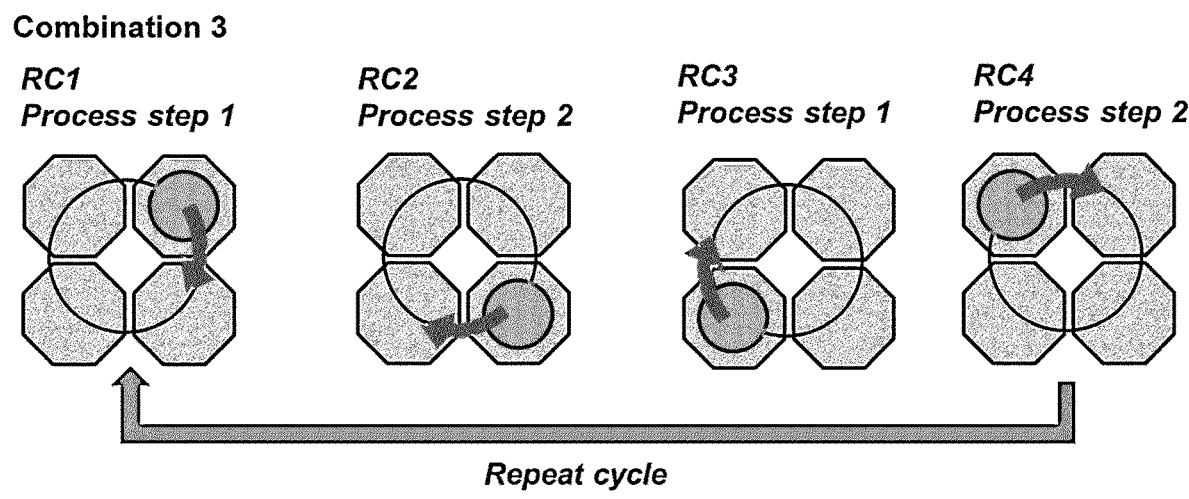
FIG. 6 is a diagram schematically illustrating a reactor and method for rotating a substrate between stations, which can optionally be repeated in accordance with some embodiments herein.

As illustrated schematically in FIG. 6, in accordance with some embodiments herein, a substrate can repeatedly be rotated between multiple stations (e.g. "RC1", "RC2", "RC3", and "RC4"). Optionally, the rotation can be repeated until a film of desired thickness is formed. A different reactant can be provided in two or more different stations. For example, each pair of stations can perform a different ALD process, or two or more pairs of stations can perform the same ALD process. That is, the pair "RC1" and "RC2" can perform "process 1", and the pair "RC3" and "RC4" can perform "process1" or "process 2". In some embodiments, a first reactant is provided in RC1, a second reactant is provided in RC2, a third reactant is provided in RC3, and a fourth reactant is provided in RC4. Optionally, for example in the context of a single selective ALD process, the first reactant is the same as the third reactant (but different from the second and fourth reactants) and the second reactant is the same as the fourth reactant (but different from the first and third reactants). Optionally, for example in the context of dual selective ALD, the first, second, third, and fourth reactants are different from each other.

Figure 7A:
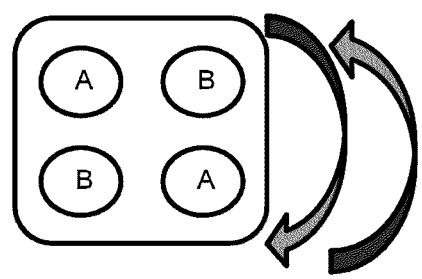
FIG. 7A is a diagram schematically illustrating swapping in accordance with some embodiments herein.
Figure 7B:
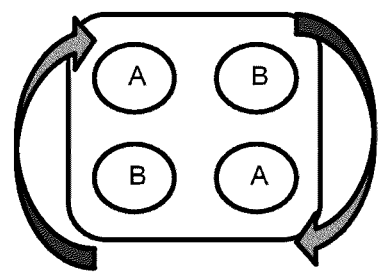
FIG. 7B is a diagram schematically illustrating rotating in accordance with some embodiments herein.

It is noted that in some embodiments, two or more pairs of stations can provide the same reactants (e.g. RC1 and RC2 provide first and second reactants, respectively and RC3 and RC4 provide first and second reactants, respectively). As such, multiple cycles of deposition could involve "rotating" a substrate among both pairs of stations (e.g. via the cycle RC1->RC2->RC3->RC4), or "swapping" the substrate between stations in a pair (repeatedly cycling substrate #1 between RC1 and RC2). Swapping is schematically illustrated in FIG. 7A. Rotating is schematically illustrated in FIG. 7B. It is noted that even if two stations provide the same reactant under the same conditions, minor differences can exist, and result in minor differences in the characteristics of deposited films. Accordingly, it is contemplated that in some embodiments herein, a substrate is moved from station-to-station via swapping (e.g. substrate #1 is in RC1 and substrate #2 is in RC2, and the substrates are swapped at the same time so that substrate #1 is in RC2, and substrate #1 is in RC1).

In some embodiments, two or more pairs of stations perform the same deposition process on two or more substrates in parallel. For example, substrate #1 is contacted with a first reactant in RC1 and substrate #2 is contacted with a first reactant in RC2. Substrate #1 is then swapped into RC3 and substrate #2 is then swapped into RC4, and a second reactant is provided in RC3 and RC4. The deposition cycle can be repeated by (a) swapping substrate #1 between RC1 and RC2 until a film of desired thickness is achieved, and (b) substrate #2 between RC3 and RC4 until a film of desired thickness is achieved. Optionally, a substrate is present in each station in pairs, and the substrates of each pair are swapped with each other (e.g. substrate #1 is in RC1, substrate #2 is in RC2, substrate #3 is in RC3, and substrate #4 is in RC4, and substrates #1 and #2 are swapped with each other, while substrates #3 and #4 are swapped with each other).

In some embodiments, the first reactant is not flowed into the first station at the same time that the second reactant is flowed into the second station. In some embodiments, the first reactant is continuously flowed into the first station and/or the second reactant is continuously flowed into the second station. Optionally, after being placed in that station and contacted with the continuously-flowed reactant, the substrate is placed in a purge location for a purge prior to being placed in a subsequent station.

In some embodiments, the first substrate is exposed to the first reactant in the first station at a different pressure than the pressure at which the first substrate is exposed to the second reactant at the second station. For example, there can be at least a 0.5-fold difference in pressure between the first station and the second station, for example, 0.5-fold, 1, 1.5, 2, 2.5, 3, 3.5, 4, 4.5, 5, 6, 7, 8, 9, 10, 15, 20, 25, 20, 40, or 50-fold difference in pressure between the two stations. In some embodiments, the first station is at a greater pressure than the second station. In some embodiments, the second station is at a greater pressure than the first station.

Substrates and Deposition Chemistries

A variety of substrates and deposition chemistries can be used in accordance with embodiments herein.

In some embodiments, single selective ALD is performed. In some embodiments, dual selective ALD is performed. Dual selective ALD can comprise selective deposition of a first film over a first exposed surface of a substrate (e.g. a dielectric), and selective deposition of a second, different film over a second, different exposed surface of a substrate (e.g. a metal). Optionally, deposition of a first thin film over the first exposed surface can be repeated until a first film of desired thickness is achieved, and deposition of a second thin film over the second surface can be repeated until the second film of desired thickness is achieved. In some embodiments, deposition of the first film of desired thickness is completed (e.g. deposition of the first thin film is repeated some number of times), and then the second film is deposited (e.g. deposition of the second thin film is repeated some number of times). In some embodiments, alternating deposition of the first film and second film are performed (e.g. deposition of the first thin film is repeated one or more times, deposition of the second thin film is repeated one or more times), and this cycle is repeated one or more times.

Figure 8A:
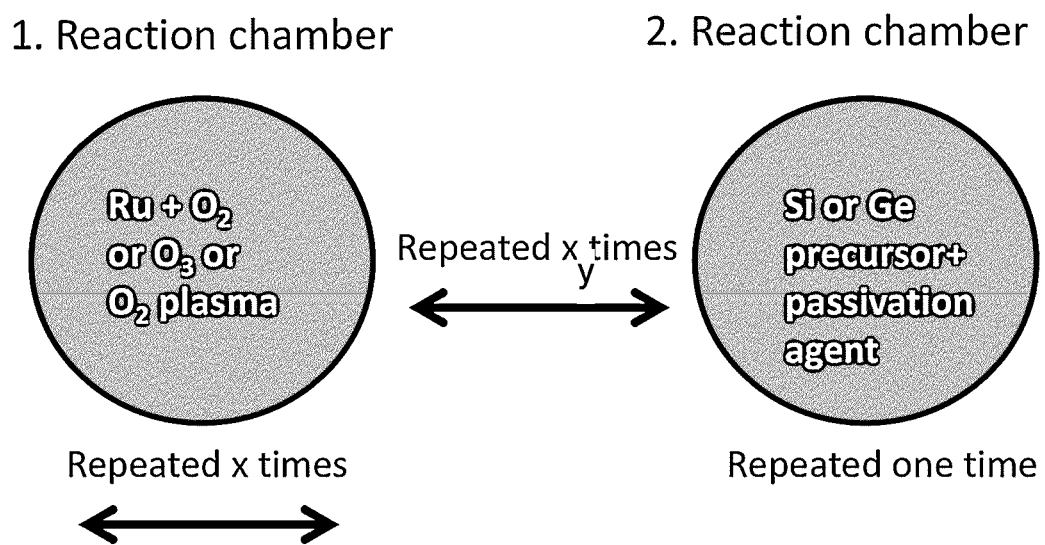
FIG. 8A is a diagram schematically illustrating $Ru/SiO_2$ or $GeO_2$ deposition in two separate stations in gas isolation from each other in accordance with some embodiments herein. FIG. $8B_1$-$8B_4$ is a process diagram illustrating a $Ru/SiO_2$ or $GeO_2$ deposition in accordance with some embodiments herein.
Figure 8C:
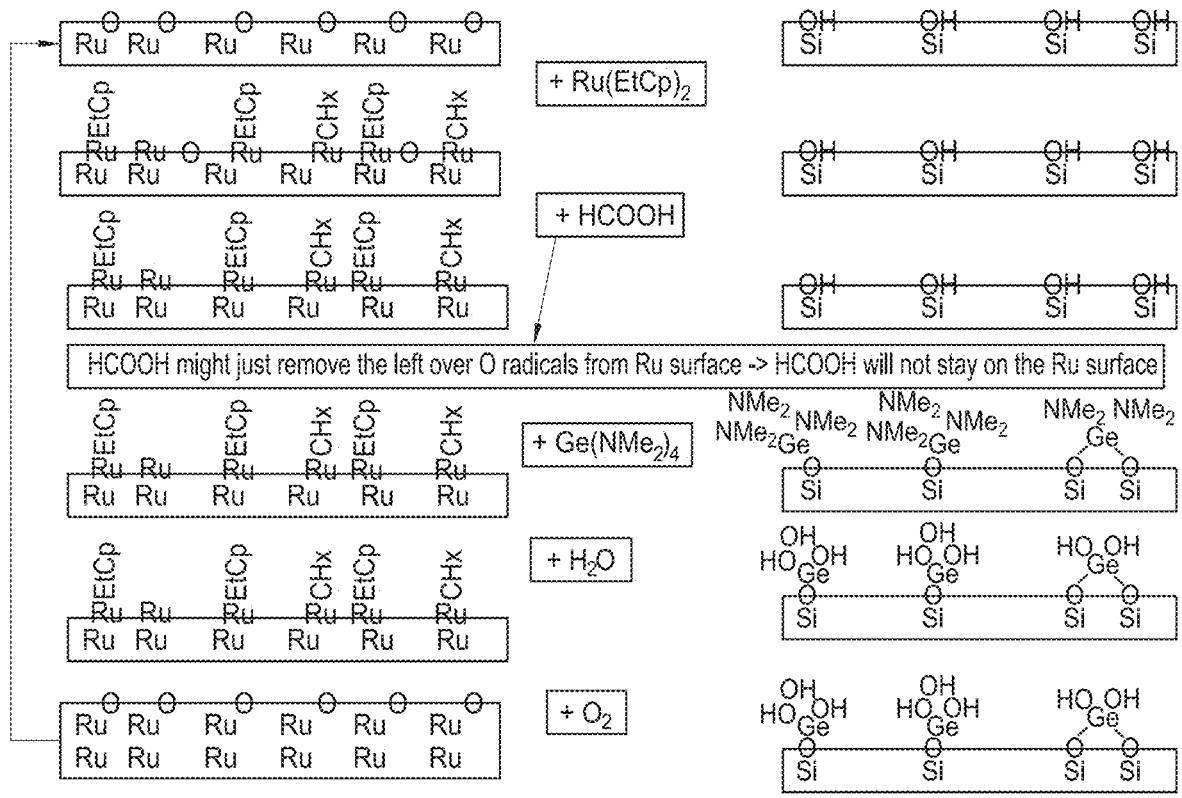
FIG. 8C is a schematic diagram illustrating chemical compounds formed in $Ru/SiO_2$ or $GeO_2$ deposition in two separate stations in gas isolation from each other in accordance with some embodiments herein.
Figure 8D:
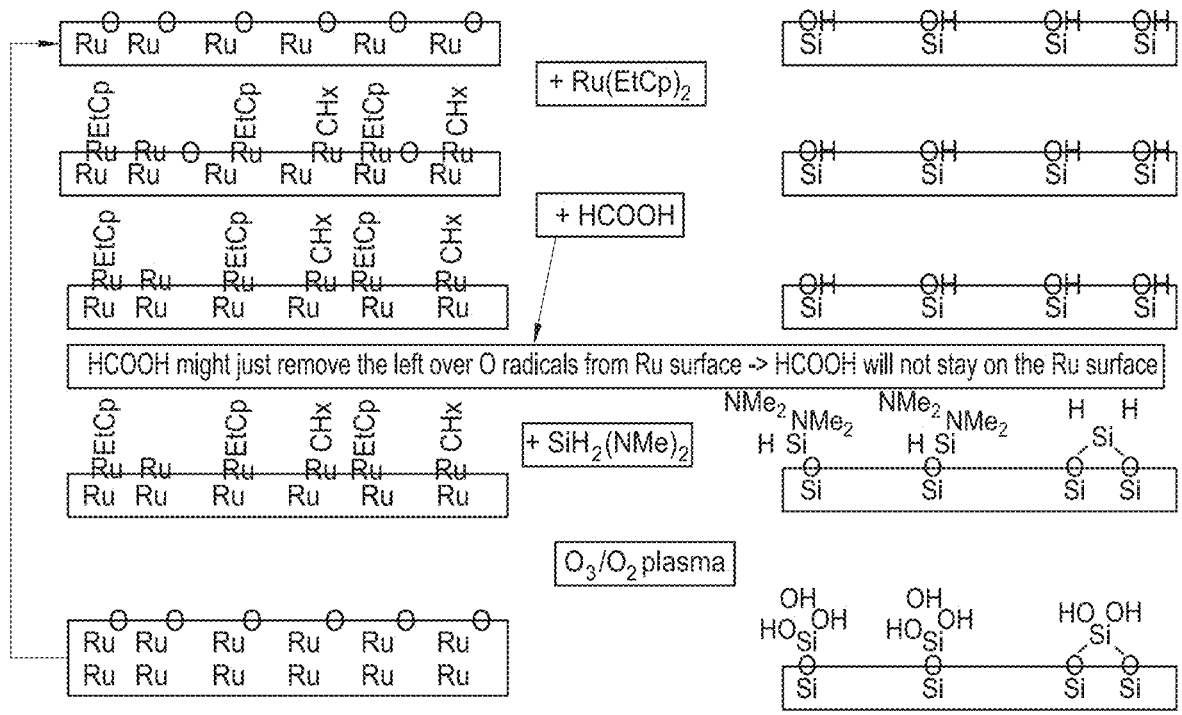
FIG. 8D is a schematic diagram illustrating chemical compounds formed in $Ru/SiO_2$ or $GeO_2$ deposition in two separate stations in gas isolation from each other in accordance with some embodiments herein.

In some embodiments, Ru is selectively deposited on a first exposed surface of a substrate (e.g. a metal), and $SiO_2$ or $GeO_2$ is selectively deposited on a second exposed surface of a substrate (e.g. a dielectric). For example, a first pair of stations provides Ru in a first station and an oxygen source (e.g. $O_2$ or $O_3$ or $O_2$ plasma) in a second station, and a second pair of stations provides a Si or Ge precursor in a third station and an oxygen source in a fourth station. Optionally, a passivation agent can be provided in a fifth station, the passivation agent passivating the SiO2 or GeO2 surface for Ru deposition, the passivation compound being a Silylation compound. An example in which Ru is selectively deposited on a first exposed surface of a substrate and $SiO_2$ or $GeO_2$ is selectively deposited on a second exposed surface in accordance with some embodiments herein is illustrated in FIGS. 8A-8C. FIG. 8A illustrates a dual selective ALD process in two chambers, one chamber for the Ru ALD deposition process and another chamber for the SiO2 or GeO2 ALD process and passivation treatment. The Ru oxygen source cycle is repeated x times and then followed by a Si or Ge oxide cycle with passivation treatment. The entire cycle is repeated y times until films of the desired thickness are obtained. FIG. $8B_1$-$8B_4$ illustrates example process steps in accordance with some embodiments herein. FIGS. 8C-8D illustrates example process chemistry and adsorption and reactions steps in accordance with some embodiments herein. Without being limited by any theory, it is contemplated that in accordance with some embodiments herein, HCOOH might just remove the left over O radicals from the Ru surface, such that HCOOH will not stay on the Ru surface.

Figure 9:
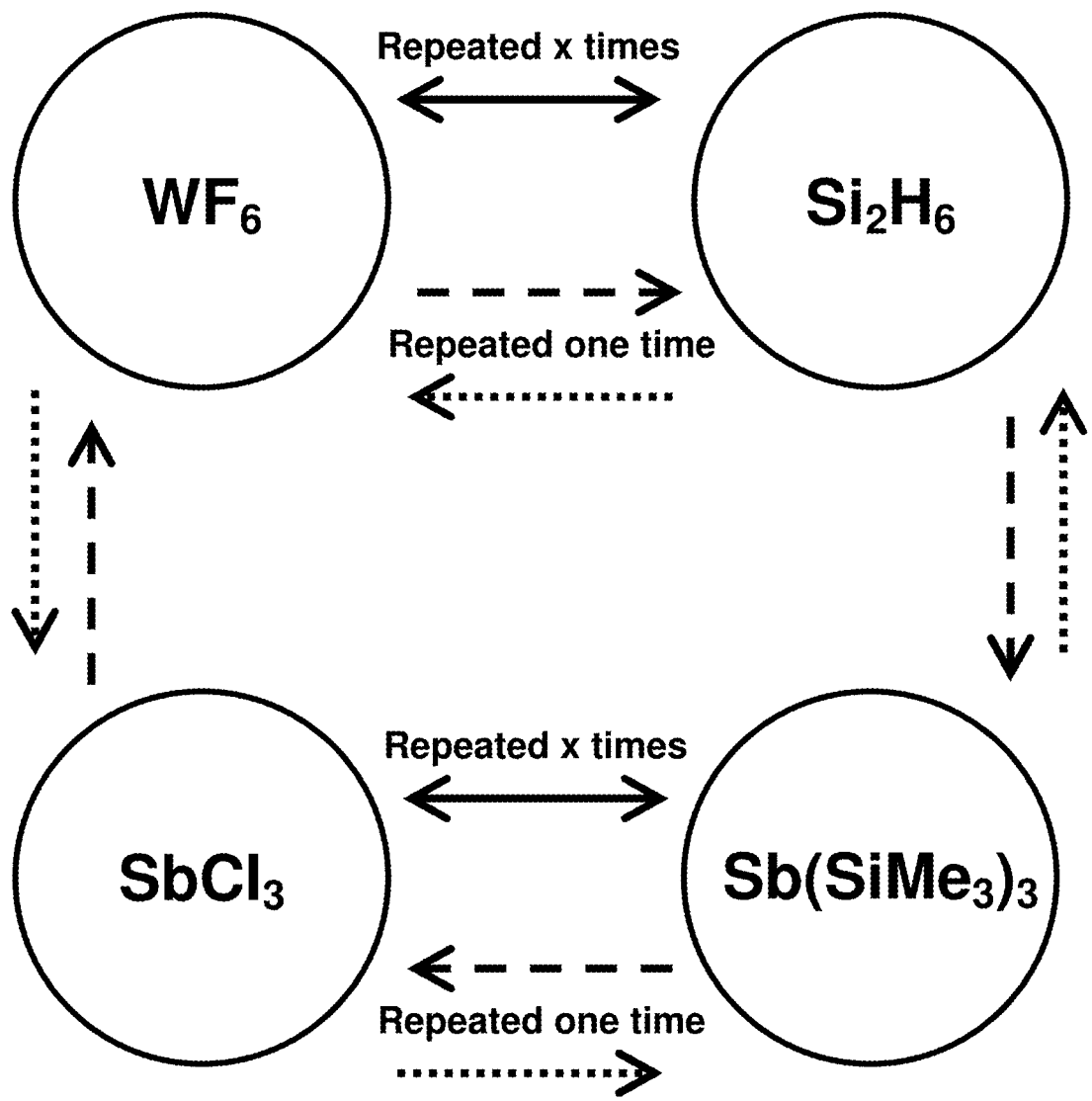
FIG. 9 is a schematic diagram illustrating various process flows for an Sb/W pair in accordance with some embodiments herein.

In some embodiments, Sb is selectively deposited on a first exposed surface of a substrate (e.g. a metal), and W is selectively deposited on a second exposed surface of a substrate (e.g. a dielectric). FIG. 9 schematically illustrates various process flows for Sb/W pair in accordance with some embodiments herein. The substrates can be transferred freely between the four stations depending on the needed number of reaction cycles for deposition of W and Sb layers.

Reactors

A reactor in accordance with some embodiments herein comprises a first station and a second station in gas isolation from each other (or in which the reactor is configured to place a given station in gas isolation from the other station after a substrate is placed in that given station), in which the first station is in gas communication with a first reactant source and the second station is in gas communication with a second reactant source, and in which the first and second reactants are different from each other. The reactor can further comprise a controller set to control the movement of the substrate from station to station, the flow of reactants into stations, and/or the purging of stations and/or purge locations. In some embodiments, the reactor comprises an ALD reactor. In some embodiments, the ALD reactor is configured for selective ALD, for example single-selective ALD or dual-selective ALD.

The reactor can be configured for ALD on a substrate. The reactor can comprise a first station configured to contain a first substrate, in which the first station is configured to contact the first substrate with a first reactant, wherein the first reactant reacts with the first substrate such that no more than one monolayer of the first reactant is adsorbed on the surface of the first substrate. The reactor can comprise a second station in gas isolation from the first station (or is placed in gas isolation from the first station concurrent with or after the substrate is placed in the second station), in which the second station is configured to contain the first substrate and to contact the first substrate with a second reactant substantially in the absence of the first reactant, and in which the second reactant is different from the first reactant and reacts with the no more than one monolayer of the first reactant, such that no more than one monolayer of desired material is formed on the first exposed surface.

The reactor can further comprise a substrate transfer system configured to place the first substrate in the first station, and subsequently place the substrate in the second station after contacting the first substrate with the first reactant. The reactor can comprise an intermediate space (see FIG. 17 for an illustration of an "intermediate space" in accordance with some embodiments herein, also referred to as a "substrate transfer space"). The substrate transfer system can comprise a substrate transfer member such as a spider configured to move the substrate within the intermediate space. In some embodiments, moveable barriers defining a station are moved, exposing the substrate to the intermediate space, and the transfer member transfers the substrate through the intermediate space to a different station, which is then placed in gas isolation via moveable barriers. In some embodiments, the substrate transfer system of the reactor comprises one or more substrate transfer mechanisms (e.g. moveable stages), in which each substrate transfer mechanism is associated with only one station, and can shuttle a substrate between its station and the intermediate space. As such, a transfer mechanism for each station can move the substrate from a particular station to the intermediate space, or from the intermediate space to the station. For example, a moveable stage can raise and lower the substrate between the intermediate space, and the station associated with that particular moveable stage. In some embodiments, the substrate transfer mechanism, or stage or susceptor in the station that is configured to receive the substrate comprises a plurality of lift pins. When the lift pins are extended, a substrate sitting on the extended lift pins can be readily accessible to the substrate transfer member (e.g. spider) for pick-up or drop-off. When the lift pins are retracted, the substrate can be positioned on the appropriate surface (e.g. surface of the stage or susceptor). In the intermediate space, the substrate can be moved from one station to another, or from one substrate transfer mechanism (e.g. moveable stage) to another, for example via a rotational substrate transfer member such as a spider (see, e.g. FIG. 10). Optionally, each substrate transfer mechanism (e.g. moveable stage) comprises a plurality of lift pins configured to extend and lift the substrate from the substrate transfer mechanism in the intermediate space. The lifted substrate can be readily picked up by a transfer member such as a spider to move the substrate to a different substrate transfer mechanism in the intermediate space. Optionally, after placing a substrate in a station (e.g. on a susceptor or stage) or on a substrate transfer mechanism associated with a station, the substrate transfer member is retracted into the intermediate space. Accordingly, the substrate transfer system can move a substrate between different stations, but no surface of the substrate transfer system is exposed to more than one station or the reactant(s) therein. That is, each portion of the substrate transfer system can be substantially exposed to only one reactant (e.g. a substrate transfer mechanism such as a moveable stage), or can be substantially exposed to no reactants (e.g. a substrate transfer member such as a spider within the intermediate space). It is contemplated that exposing each surface to no more than one reactant can minimize undesired ALD and/or CVD reactions on that surface. The reactor can be configured to place the first substrate in the first station after contact the first substrate with the second reactant, for example under the control of a controller as described herein. Optionally, the reactor is configured to repeat the process until a film of desired thickness is deposited over the exposed surface. Optionally no surfaces of the reactor are contacted with both the first and second reactant (e.g. surfaces of the first and second station, gas source lines, purge lines, substrate transfer members, susceptors, and/or substrate transfer mechanism, if present, are not contacted with both the first and second reactant). It is noted, however, that a substrate can be contacted by both the first and second reactant.

In some embodiments, the reactor is configured for selective ALD on a first substrate comprising two different exposed surfaces. The reactor can comprise a first station configured to contain a first substrate comprising a first exposed surface and a second exposed surface, in which the first station is configured to contact the first substrate with a first reactant, wherein the first reactant preferentially reacts with the first exposed surface relative to the second exposed surface such that no more than one monolayer of the first reactant is adsorbed on the first exposed surface. The reactor can comprise a second station in gas isolation from the first station (or that can be placed in gas isolation from the first station concurrent with or after the substrate is placed in the second station), in which the second station is configured to contain the first substrate and to contact the first substrate with a second reactant substantially in the absence of the first reactant, and in which the second reactant is different from the first reactant and preferentially reacts with the no more than one monolayer of the first reactant on the first exposed surface relative to the second exposed surface, such that no more than one monolayer of desired material is formed on the first exposed surface. The reactor can further comprise a transfer member configured to place the first substrate in the first station, and subsequently place the substrate in the second station after contacting the first substrate with the first reactant, and wherein the reactor is configured to place the first substrate in the first station after contact the first substrate with the second reactant. Optionally, the transfer member comprises a spider. Optionally, the transfer member comprises a rotary member, for example a rotating substrate holder. The reactor can further be configured to repeat contacting the first substrate in the first station with the first reactant substantially in the absence of the second reactant and contacting the first substrate in the second station with the second reactant substantially in the absence of the first reactant until a film of desired thickness is selectively formed on the first surface but not the second surface. Optionally, the transfer member is configured to move the substrate between two or more different pairs of stations. Optionally, the transfer member is configured to repeatedly swap the substrate between a particular pair of stations. The ALD reactor can further comprise a controller set to move the substrate via the transfer member to the first station, direct the first station to contact the first substrate with the first reactant, move the substrate to the second station via the transfer member, and direct the second station to contact the first substrate with the second reactant. Optionally, the reactor is configured to perform selective deposition on two or more wafers in parallel. For example, two or more wafers can undergo selective in two or more different pairs of stations. For example, a pair of wafers can simultaneously undergo selective in the same pair of stations (so that wafer #1 starts out in station #1, wafer #2 starts out in station #2, and then wafer #1 is swapped with wafer #2, and the swapping is repeated until a film of desired thickness is formed).

In some embodiments, the reactor comprises at least 2 pairs of stations, for example at least 2, 3, 4, 5, 6, 7, 8, 9, 10, 11, 12, 13, 14, 15, 16, 17, 18, 19, 20, 25, 30, 35, 40, 45, or 50 pairs of stations, including ranges between any two of the listed values. Optionally, some or all of the stations are constantly in gas isolation from each other. Optionally, some or all of the stations can be placed in gas isolation from each other prior to, upon, or after the substrate is placed in the station, for example by enclosing the substrate within physical barriers as described herein. It is contemplated that the reactor can be configured to hold as many wafers as there are stations, or optionally fewer wafers than there are stations. In some embodiments, the ratio of wafers being processed by the reactor to number of stations is less than 1:1, for example, less than 0.9:1, 0.8:1, 0.7:1, 0.6:1, 0.5:1, 0.4:1, 0.3:1, 0.2:1, 0.1:1, 0.05:1, or 0.01:1, including ranges between any two of the listed values. Optionally, the rotary substrate transfer member is configured so that the substrate stops at least at one station (e.g., so that the substrate is not continuously in motion during the deposition process). Example arrangements of stations in accordance with some embodiments herein are illustrated in FIGS. 5, 6, 10, 11A-C, 14A-C, 18, and 19A.

Optionally, the reactor is configured for linear movement of the substrate. For example, linear movement among a series of stations can be compatible with "swapping" or "rotating" the substrate as described herein.

Figure 10:
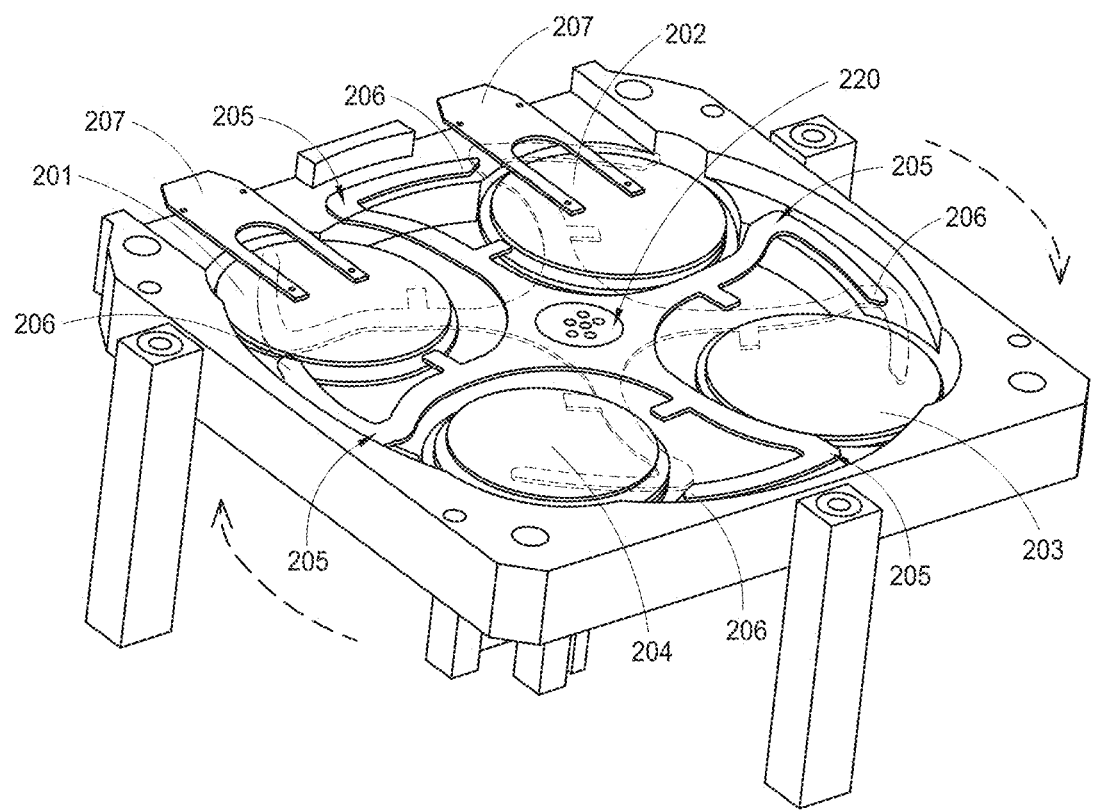
FIG. 10 is a schematic diagram illustrating a spider in accordance with some embodiments herein.

As used herein a "substrate transfer member" or "transfer member" refers to a structure such as a rotary member or spider that can move a substrate from a first station (or from a transfer mechanism associated with the first station) to a second station (or to a transfer mechanism associated with the second station). In some embodiments, the transfer system comprises a transfer member comprising a spider. A "spider", as used herein, refers to a wafer transfer member having multiple arms, each arm configured for engaging with a wafer through a spider end effector. The spider can be disposed centrally relative to a number of reaction stations. An example spider in accordance with some embodiments herein is illustrated in FIG. 10. FIG. 10 is a schematic drawing illustrating a spider 200 centrally disposed relative to 4 reaction stations 201, 202, 203, and 204. The spider has 4 arms 205, each arm provided with a spider end effector 206 for engaging a wafer. When the wafers needed to be transferred, the wafers are elevated by lift pins or similar structures, and the spider 200 is rotated so that the spider end effectors 206 are underneath the wafer and the spider end effectors engage with the wafers. Then the spider is rotated over 90 degrees (or a different value, if there is a different number of stations; for evenly distributed stations, the value can be 360 degrees divided by the number of stations), the spider end effector 206 disengages with the wafers, leaving the wafers seated on a surface (e.g. on a susceptor in a station, or on a substrate transfer mechanism as described herein), which can also comprise lift pins or similar structures for elevating the substrate. Then the spider 200 can be moved to an intermediate position, in between the stations 201, 202, 203, 204, so that when the stations are brought in gas isolation with each other, the spider nor any of its constituting parts are exposed to any of the reaction gases. Optionally, additional end effectors 207 can move the wafer out of the cluster of reaction stations, and into a wafer handling chamber, load lock chamber, and/or another cluster of reaction stations. It is noted that for the substrate transfer system described above, no surface of the reactor is substantially contacted with two different reactants. For example, a substrate itself can be substantially contacted with two or more different reactants, and the spider is substantially contacted with no more than one reactant (or in some embodiments, the spider is not substantially contacted with any reactant).

In some embodiments, the substrate transfer system comprises a plurality of "substrate transfer mechanisms", in which each substrate transfer mechanism is associated with only one station, and can shuttle a substrate between a particular station and the intermediate space, for example by raising and lowering. Optionally, each substrate transfer mechanism (e.g. moveable stage) comprises a plurality of lift pins configured to extend and lift the substrate from the substrate transfer mechanism in the intermediate space. The lifted substrate can be readily picked up by a transfer member such as a spider to move the substrate to a different substrate transfer mechanism in the intermediate space. As such, each substrate transfer mechanism is exposed to no more than one station, and thus is substantially exposed to no more than one reactant (or process step). In some embodiments, each substrate transfer mechanism comprises a moveable stage.

Figure 16:
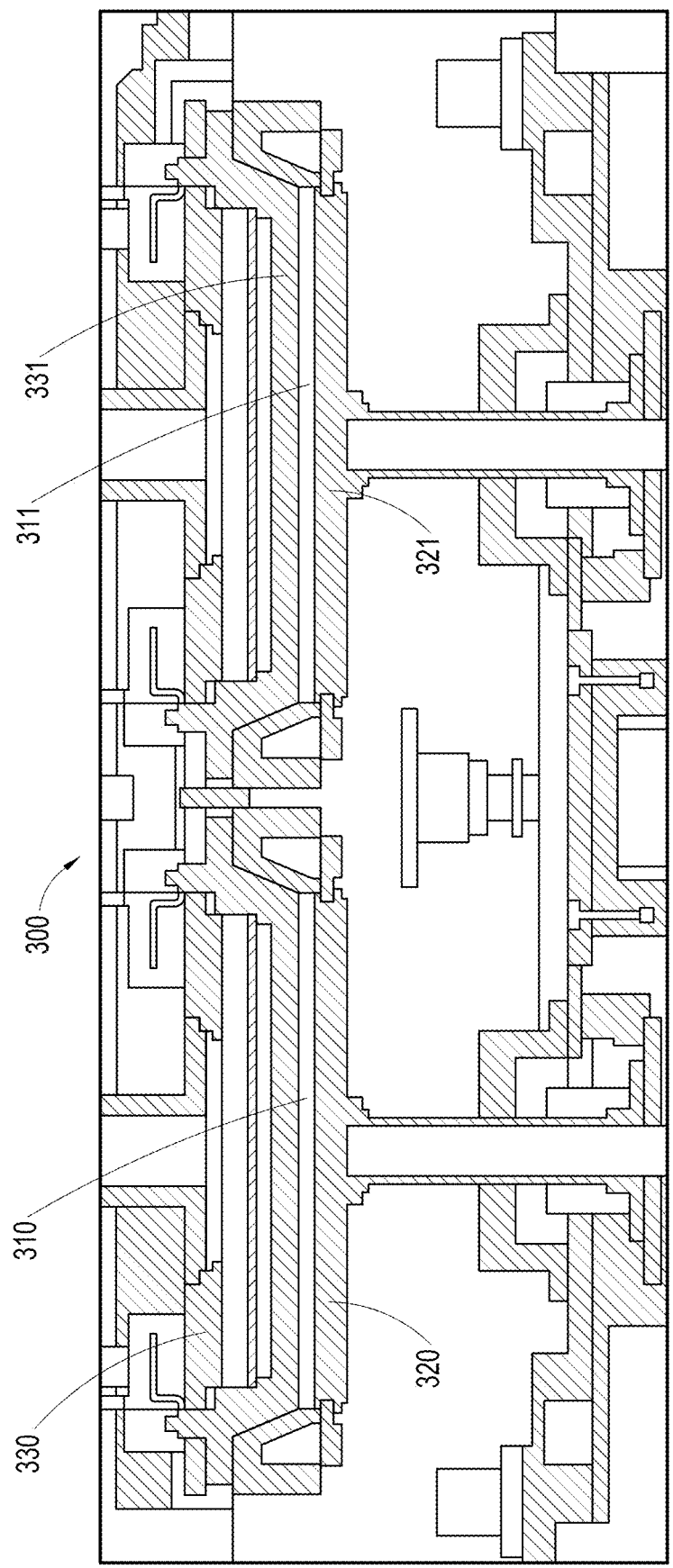
FIG. 16 is a diagram illustrating a cross section of a process module (PM) which has substantially separated plural reactor chambers (RCs, each RC comprising a station) in accordance with some embodiments herein. By way of example.

FIG. 16 shows a cross section of a process module (PM) 300 which has plural reactor chambers (RCs) 310, 311 in gas isolation from each other in accordance with some embodiments herein (e.g. so that each RC comprises a different station). One or more stages 320, 321 can be moved (e.g. up or down) so that the PM can comprise an intermediate space (see 315 in FIG. 17). As shown in FIG. 16, each stage 320, 321 is positioned (in an "up" position") so that a surface 330, 331 of the PM and the stages 320, 321 each define a RC 310, 311 that comprises a single station in accordance with some embodiments herein. Optionally, stages of the various stations can be moved between their particular station and a single intermediate space, so that a substrate can be moved from the intermediate space to any of the stations and can be placed in the intermediate space from any of the stations. As such, the intermediate space in accordance with some embodiments herein permits substrate transfer between the PM and WHC or between each stage in the PM (see FIG. 18). In some embodiments, the reactor is equipped with one or more substrate transfer systems, one for transfer LLC-PM, and the other is RC-RC transfer in the PM. Each RC (each RC comprising a different station) in the PM is equipped with independently controllable systems of gasses, pressure, temperature, RF and other parameters as needed.

Figure 17:
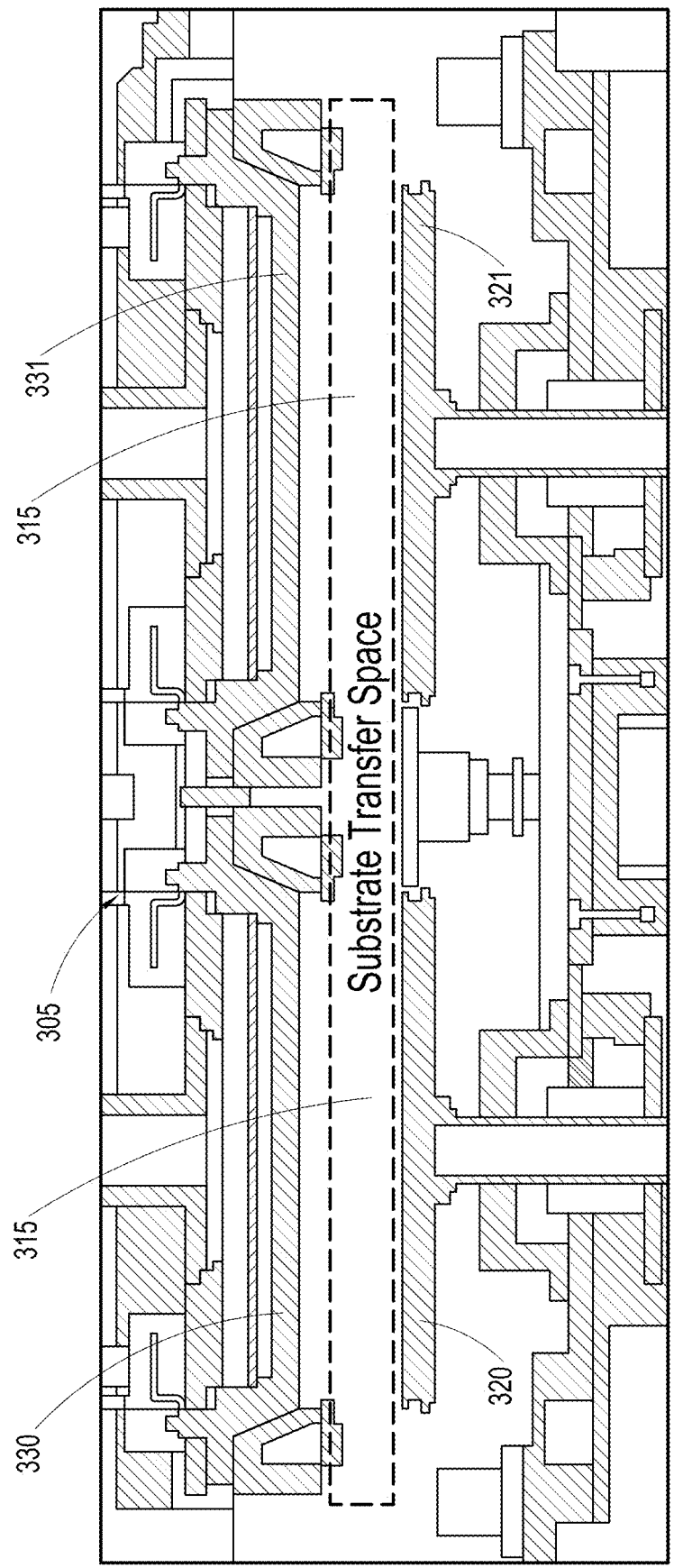
FIG. 17 is a diagram illustrating a cross section of the process module (PM) in substrate transferring in accordance with some embodiments herein. The PM can make one intermediate space by movement of the stages. By way of example.
Figure 18:
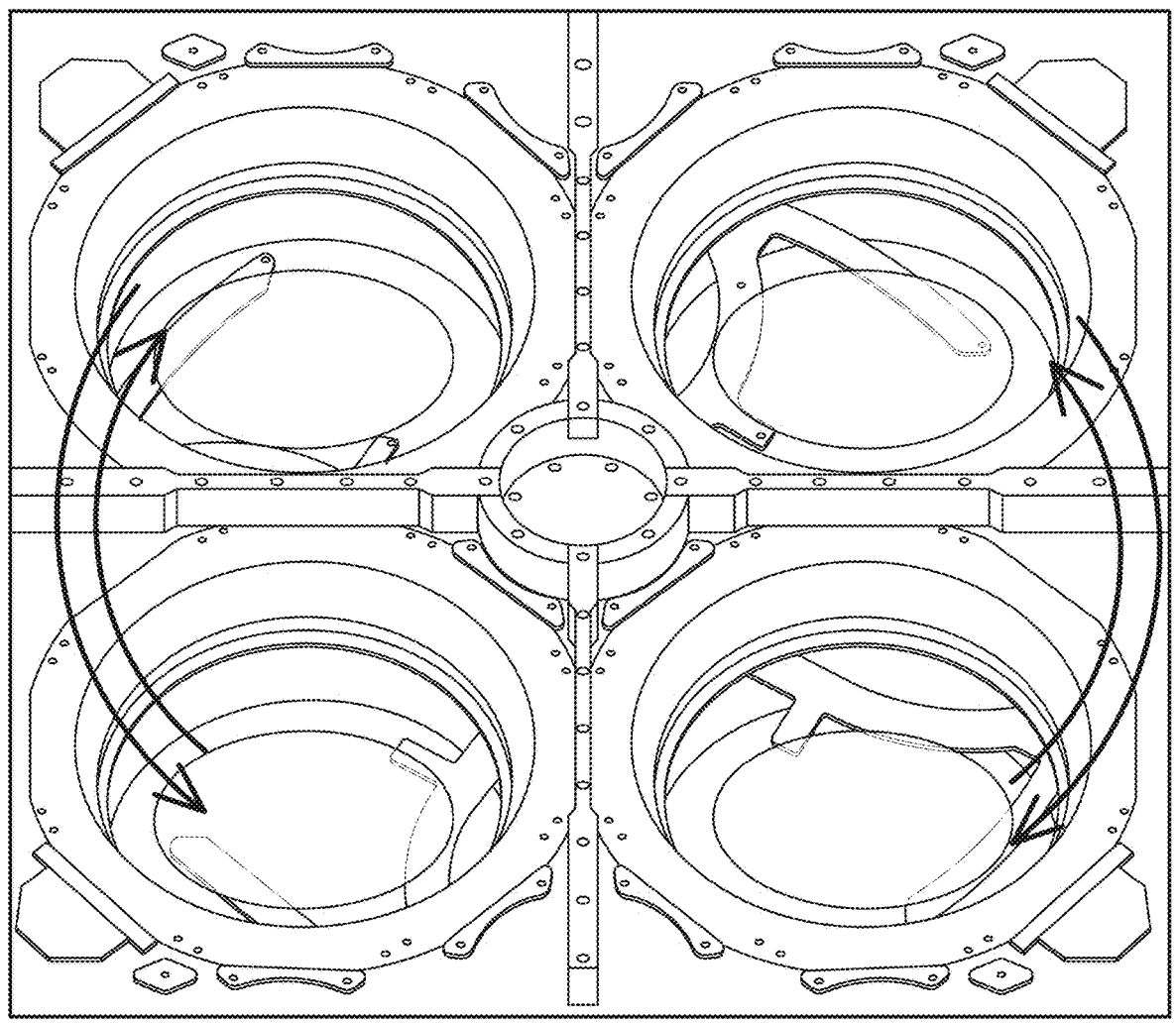
FIG. 18 is a diagram illustrating a rotation substrate transfer in the process module (PM) in accordance with some embodiments herein. The intermediate space enables substrate transfer between the PM and WHC or between each stage in the PM.

FIG. 17 is a diagram that shows a cross section of a process module (PM) 305 which comprises an intermediate space 315. In accordance with some embodiments herein, stages 320, 321 each corresponding to the various stations can be moved between their particular station (e.g. RC 310, 311) and a single intermediate space 315, so that a substrate can be moved from the intermediate space 315 to any of the stations 310, 311 and can be placed in the intermediate space 315 from any of the stations 310, 311. As shown in FIG. 17, each stage 320, 321 is positioned (in a "down" position) so that an intermediate space 315 is provided between the stages 320, 321 and the surfaces 330, 331 of the PM. As such, the intermediate space 315 in accordance with some embodiments herein permits substrate transfer between the PM and WHC or between each stage 310, 311 in the PM.

Figure 12:
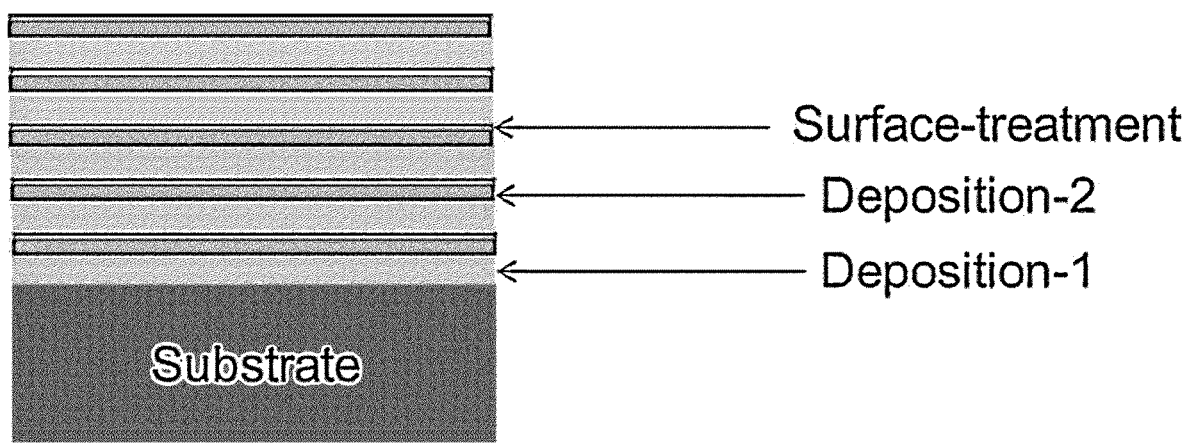
FIG. 12 is a diagram showing an example of repeating lamination of different films from plural different processes on a substrate in accordance with some embodiments herein. The different processes can comprise a combination, for example, deposition, etching, and/or pre-/post-surface treatment.
Figure 19A:
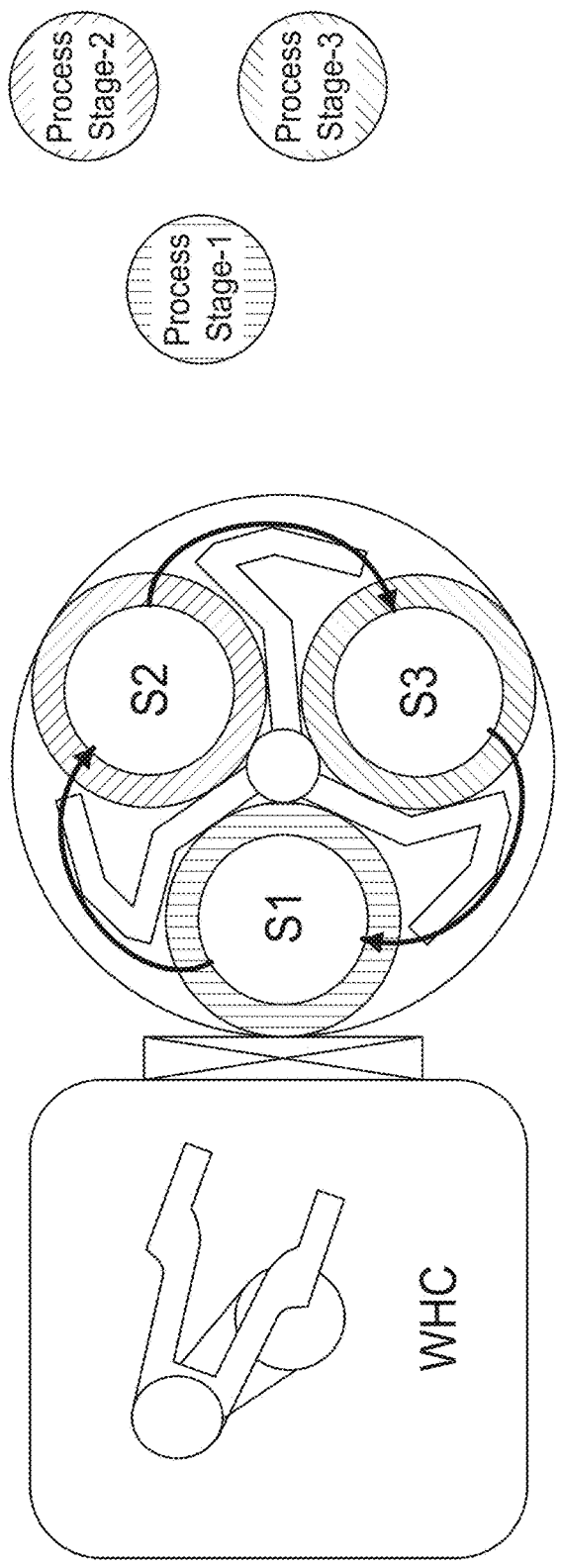
FIG. 19A is a diagram illustrating a tool configuration example in which the central WHC is combined with a PM comprising three RCs (each RC comprising a station) in gas isolation from each other in accordance with some embodiments herein. Each RC has a process stage in it. In the center of the PM, a stage-stage substrate transfer mechanism is also provided as part of the substrate transfer system. The substrate transfer system transfers the substrate by up/down and rotational movement.
Figure 19B:
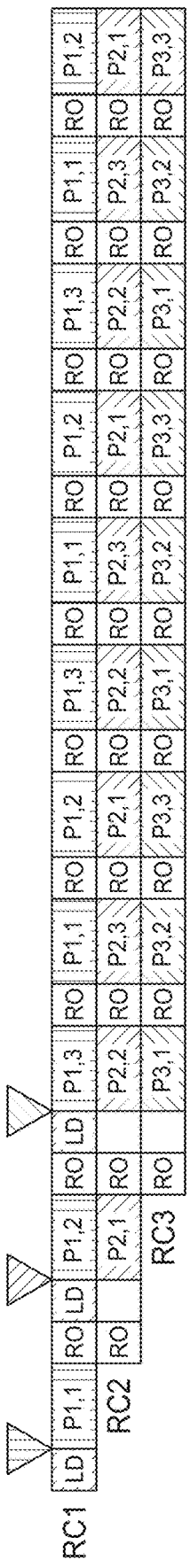
FIG. 19B is a process flow which can be used, for example, in conjunction with the configuration of FIG. 19A in accordance with some embodiments herein.

FIG. 19A shows a reactor configuration in accordance with some embodiments herein in which the central WHC is in conjugation with a PM comprising three RCs in gas isolation (e.g. so that each RC comprises a different station), and each RC has a process stage in it. In the center of the PM, a stage-stage transfer mechanism comprising a spider is also provided as part of the substrate transfer system. Each stage can be raised and lowered so that the stage can move between a chamber and the intermediate space, and the spider can rotate a substrate between different stages in the intermediate space. As such, the substrate transfer system can transfer the substrate by up/down and rotational movement. FIG. 19B shows a sequence wherein three different processes (such as shown in FIG. 12) on three wafers at the same time. In FIG. 19B, the three different processes are repeated simultaneously on three substrates by turning. The three substrates can be undergoing the three different processes continuously (e.g., so that each substrate is undergoing one of the processes at any given time), so as to minimize "waiting" steps in accordance with some embodiments herein. It is noted that the process of FIG. 19B comprises few RC "waiting" steps so that all of the RCs are working, and for at least this reason provides a substantially more efficient sequence compared to the conventional case shown in FIG. 13.

Figure 20:
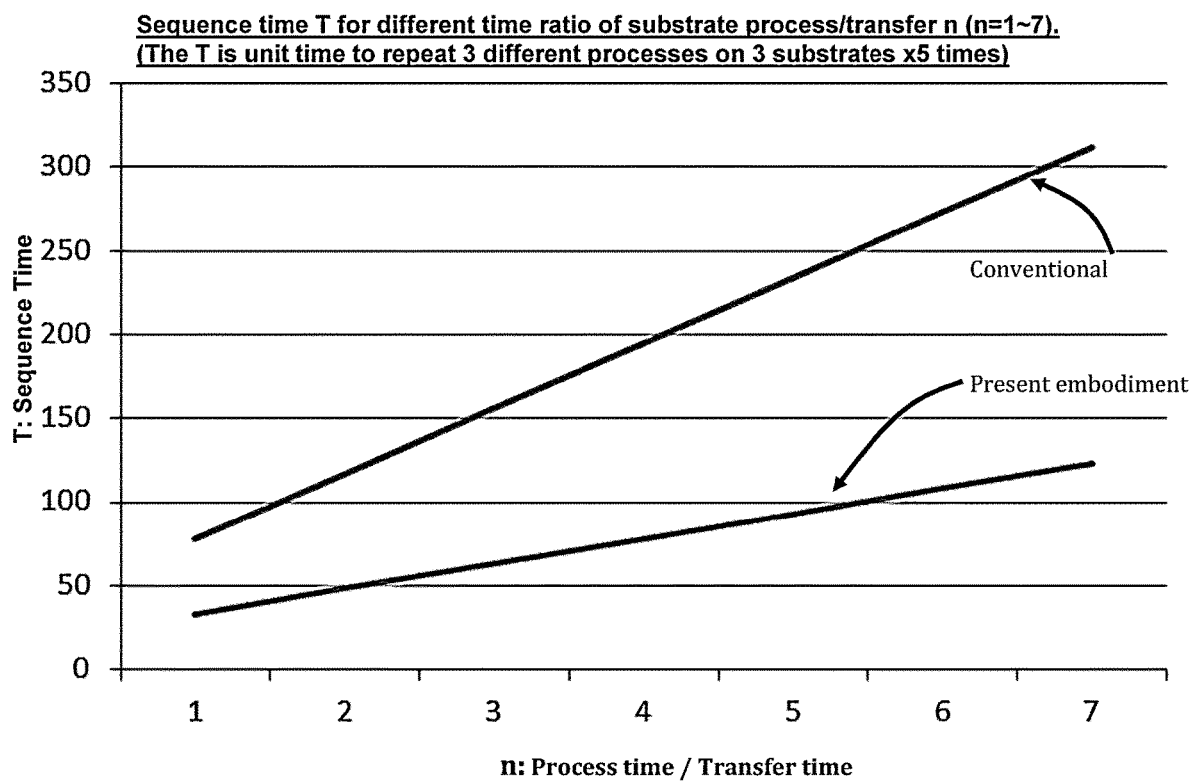
FIG. 20 is a graph that shows the sequence when three different processes are repeated (such as in FIG. 12) on three wafers at the same time in accordance with some embodiments herein. It is observed that there are few RC waiting steps, and a much more efficient sequence is executed compared to the conventional tool case shown in FIG. 13. Total sequence time T is compared between conventional tool and a reactor in accordance with some embodiments herein. The T is plotted for variable time ratio of process/transfer n (n=1~7). The simulation was done under precondition of repeating 3 different processes on 3 substrates ×5 times.

Without being limited by any theory, substrate processing time is generally longer than the transfer time. It is contemplated that in accordance with some embodiments herein, substrate processing time is longer than the transfer time. In FIG. 20, total sequence times for different process times is simulated. Total sequence time T is compared between conventional tool and this invention. The T is plotted for variable time ratio of process/transfer n (n=1~7). The simulation was done under precondition of repeating 3 different processes on 3 substrates ×5 times. The T is given by a formula of T=39 n+39 for a conventional tool (see, e.g. FIG. 13), and by T=15 n+18 for reactors and processes in accordance with some embodiments herein, such as in FIG. 19B. It is noted that the processes in accordance with some of the present embodiments reduced the sequence time T by about 60%, and provide for about 2.5 times more efficient productivity. It is noted that FIG. 20 illustrates that, in accordance with some embodiments herein, the productivity is high regardless of process time length, and thus, processes and reactors in accordance with some embodiments herein can yield high efficiency regardless of process time length.

Figure 21:
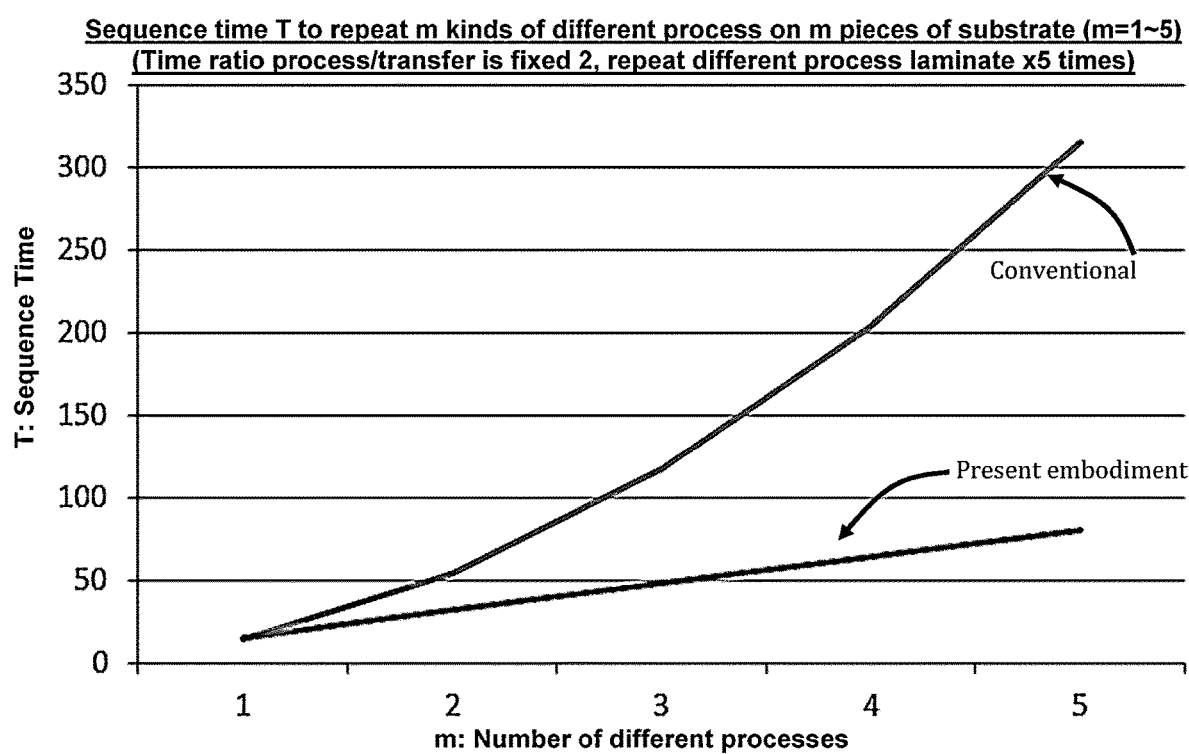
FIG. 21 is a graph that shows the sequence time T when we repeat m kinds of different processes on m pieces of substrates (m=1~5)×5 times. In this simulation, the process/transfer time ratio was fixed 2 (n=2). The T is given by a formula of T=12 m2+3 m in case of conventional tool configuration, and given by T=16 m for case of this invention. The graph shows the advantage gets bigger and bigger as m takes a larger number.

FIG. 21 shows the sequence time T when m kinds of different processes are repeated on m pieces of substrates (m=1~5)×5 times in accordance with some embodiments herein. In this simulation, the process/transfer time ratio was fixed 2 (n=2). The T is given by a formula of T=12 m2+3 m in case of for a conventional tool configuration (see, e.g. FIG. 13), and given by T=16 m for reactors and processes in accordance with some embodiments herein, such as in FIG. 19B. The graph shows the advantage gets bigger and bigger as m takes a larger number (i.e., in comparison to conventional approaches, as more different kinds of processes are performed, the conventional configuration gets more RC waiting status, while configurations in accordance with embodiments herein show a bigger advantage).

Figure 11A:
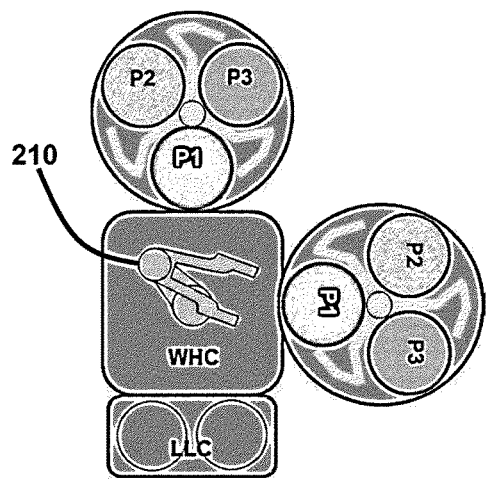
FIG. 11A is a top-down diagram of a reactor in accordance with some embodiments herein. Each reaction chamber comprises three process chambers (P1, P2, P3, each process chamber comprising a different station in gas isolation from the other stations), in which a spider moves the substrate from process chamber-to-process chamber. An end effector 210 stationed in a wafer handling chamber (WHC) can add and remove substrates from the spider (in communication with the process chambers) and/or a load lock chamber (LLC).
Figure 11B:
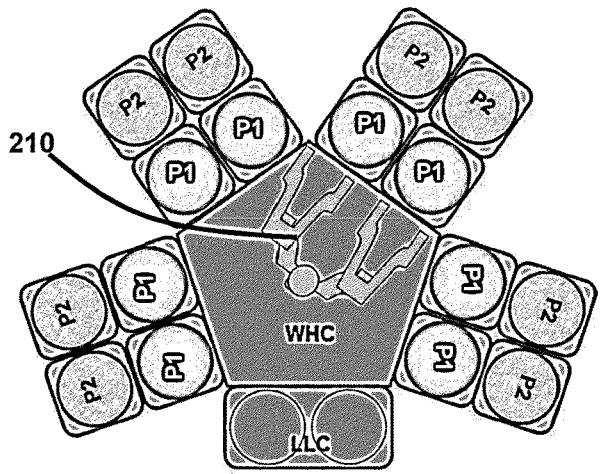
FIG. 11B is a top-down diagram of a reactor in accordance with some embodiments herein. Each reaction chamber comprises two of a first kind process chamber (P1) and two of a second kind of process chamber (P2). As such, multiple wafers can be swapped between P1 and P2 in each reaction chamber. The reactor also comprises a wafer handling chamber (WHC) that comprises an end effector 210 which can add or remove substrates from the spider (in communication with the process chambers) and/or add or remove substrates from a load lock chamber (LLC).
Figure 11C:
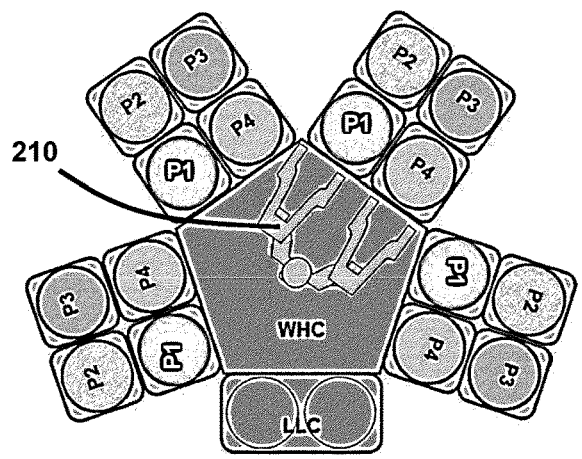
FIG. 11C is a top-down diagram of a reactor in accordance with some embodiments herein. Each reaction chamber comprises four process chambers (P1, P2, P3, P4). As such, a wafer can rotate between the four different process chambers. The reactor also comprises a wafer handling chamber (WHC) that comprises an end effector 210 which can add or remove substrates from the spider (in communication with the process chambers) and/or add or remove substrates from a load lock chamber (LLC).

Additional examples of configurations of reactors in accordance with some embodiments herein are illustrates in FIGS. 11A-C. In some embodiments, the reactor comprises the configuration of any of FIGS. 11A-C, or a combination of two or more of these configurations.

In some embodiments, the transfer system comprises a rotating substrate holder configured to remove the first substrate from the first station and place the first substrate in the second station by rotation. Optionally, the ALD reactor comprises a rotary indexing reactor. The rotary indexing reactor can comprise a rotary member such as a table configured to rotate one or more substrates between a plurality of stations. Optionally the rotary member can be driven by a servomotor.

Optionally the stations of the ALD reactor comprise showerhead or showerhead-like distributors configured to flow reactant from the center to the edge of the substrate. It is contemplated that distributing the reactant in such a manner can minimize or eliminate edge effects, which can be characteristic of a cross-flow design. The rotary reactor maintains the stations in gas isolation. Optionally, the rotary indexing reactor maintains the gas isolation via physical walls or other physical barriers. Optionally, the rotary indexing reactor does not rely upon gas bearings or gas walls to maintain the gas isolation. Optionally, the rotary indexing reactor comprises at least 2 stations, for example at least 2, 3, 4, 6, 7, 8, 9, 10, 11, 12, 13, 14, 15, 16, 17, 18, 19, or 20, including ranges between any two of the listed values. Optionally, the rotary indexing reactor can have variable index and dwell times. In some embodiments, the index time of the indexing reactor is configured for a particular time per particular number of degrees of rotation, and as such, the duration of the index time depends on the number of wafers (e.g. in some embodiments, there is an index time of 100 msec/30 degrees, so for a rotary member comprising 6 substrates, there would be 60 degrees per substrate yielding an index time of 200 msec). It is noted that faster the rotation speed of the rotary indexing reactor, the less time that the substrate spends during transfer from station to station. In some embodiments, the indexing speed is not dependent on deposition time (for example, if deposition time is relatively brief and purge time is rate-limiting). Accordingly, in some embodiments, the rotary indexing reactor provides a full dose of each reactant to the wafer independent of the radial position relative to the platen center of the rotation. In some embodiments, the rotary indexing reactor is characterized by at least one of a large batch, high throughput, flexibility for multi-component films, ability to control particles, and/or amenability to PEALD processes.

In some embodiments, the ALD reactor is configured to prevent the simultaneous presence of substantial quantities of the first reactant and the second reactant in any station of the ALD reactor. For example, each station can comprise barriers such as physical barriers as described herein and/or gas barriers to maintain isolation. For example, each station can comprise physical barriers as described herein but not gas barriers to maintain isolation. Optionally, the ALD reactor comprises one or more scavengers. It is contemplated that scavengers can further enhance gas isolation. For example, gas scavengers comprising vacuums can remove any reactants that have escaped the stations, and prevent or minimize the escaped reactants from entering other stations. In some embodiments, scavengers are positioned between stations. In some embodiments, scavengers are positioned adjacent to stations. In some embodiments, the stations comprise scavengers.

In some embodiments, the ALD reactor further comprises a purge location, configured to receive the first substrate after contacting the first substrate with the first reactant, but prior to placing the first substrate in the second station. The purge location can be configured to perform a purge with the first substrate therein. The purge location can be not in gas communication with the first station, and is not in gas communication with the second station. In some embodiments, the first station is configured to purge the first reactant after contacting the first substrate with the first reactant, and before placing the first substrate in in the second station. In some embodiments, the first station performs the purge while the first substrate is inside the first station. In some embodiments, an initial part of the purge is performed at the first station while the first substrate is inside the first station, the substrate is removed from the first station during the purge and transferred to a purge station, and the purge is completed at the purge station (for example, if the first reactant characteristically has a long purge time).

Without being limited by any theory, it is contemplated that maintaining gas isolation between stations as described herein can minimize or eliminate undesired CVD reactions. Accordingly, in some embodiments, the ALD reactor is configured to substantially prevent CVD reactions from occurring on any surface of the first and second stations of the ALD reactor.

In some embodiments the stations of the ALD reactor are fixed relative to each other. Optionally, the substrate can be removed from and placed in various stations while the stations remain stationary. Optionally, the stations can be moved relative to the substrate, but remain in a fixed position relative to each other. In some embodiments, the substrate is moved from station to station, but is not in motion when it is contacted with a reactant at a station.

In some embodiments, the controller comprises a processor that provides instructions for the transfer system to the first station, and/or move the substrate to the second station via the transfer system. The processor can further provide instructions to direct the first station to contact the first substrate with the first reactant. The processor can further provide instructions to direct the second station to contact the first substrate with the second reactant. The processor can further direct each station to provide the reactant at a particular temperature (or range of temperatures) and/or pressure (or range of pressures). The processor can further provide instructions for a susceptor to heat a substrate to a particular temperature, or allow a substrate to cool to a particular temperature. The processor can further provide instructions to purge a station, for example by flowing an inert gas into the station, and/or by applying a vacuum to a station. The processor can further provide instructions to a purge location to provide a purge while a substrate is therein, for example by flowing an inert gas into the purge location, and/or by applying a vacuum to the purge location.

In some embodiments, the ALD reactor is configured to automatically repeat deposition cycles until a film of desired thickness is obtained. As such, the ALD reactor can be configured to repeat one or more deposition cycles without intervention by an operator such as a human operator.

In some embodiments, the ALD reactor is configured to process two or more substrates simultaneously, and in different pairs of stations. The pairs can be configured to perform the same or different ALD processes. In some embodiments, the ALD reactor comprises a third station in gas isolation from the first station and second station (or that can be placed in gas isolation from the first and second station concurrent with or after the substrate is placed in the third station), the third station configured to hold a second substrate comprising a third exposed surface and a fourth exposed surface. The third station can be configured to contact the second substrate with the first reactant, thereby adsorbing no more than one monolayer of the first reactant on the third exposed surface. The ALD reactor can also comprise a fourth station in gas isolation from the first station, second station, and third station (or that can be placed in gas isolation from the first, second, and third stations concurrent with or after the substrate is placed in the fourth station), in which the fourth station is configured to contact the second substrate with the second reactant substantially in the absence of the first reactant, wherein the second reactant reacts with the no more than one monolayer of the first reactant on the third exposed surface but not the fourth exposed surface, such that no more than one monolayer of the second reactant is adsorbed on the third exposed surface.

In some embodiments, the ALD reactor is configured for single selective ALD, so that a first film is selectively deposited on a first surface of the substrate. In some embodiments, the ALD reactor is configured for dual selective ALD, so that a first film is selectively deposited on a first surface of the substrate, and a second, different film is selectively deposited on a second, different surface of the substrate. In some embodiments, the ALD reactor further comprises a third station in gas isolation from the first station and second station (or that can be placed in gas isolation from the first and second station concurrent with or after the substrate is placed in the third station), the third station configured to contain the first substrate, in which the third station is configured to contact the first substrate with a third reactant that is different from the first and second reactants, thereby adsorbing no more than one monolayer of the third reactant on the second exposed surface of the substrate. The ALD reactor can further comprise a fourth station in gas isolation from the first station, second station, and third station (or that can be placed in gas isolation from the first, second and third stations concurrent with or after the substrate is placed in the fourth station) and configured to contain the first substrate, in which the fourth station is configured to contact the first substrate with a fourth reactant that is different from the first, second, and third reactants, and substantially in the absence of the first, second, and third reactants, wherein the fourth reactant reacts with the no more than one monolayer of the third reactant but not the first exposed surface, such that no more than one monolayer of the fourth reactant is adsorbed on the second exposed surface.

Additional Embodiments

In semiconductor and LCD industry, a method of making different processes on a substrate without exposing it to the air is often performed. In addition, multiple processes in which process conditions (e.g. the gas flow, pressure and/or temperature) are different are sometimes repeated alternately on a substrate. For example, in accordance with some embodiments, a laminate processing is performed with a combination of processes such as deposition, etching and pre/post surface treatment. FIG. 12 shows an example of repeating three different processes by turns on one substrate, in accordance with some embodiments herein.

Figure 13A:
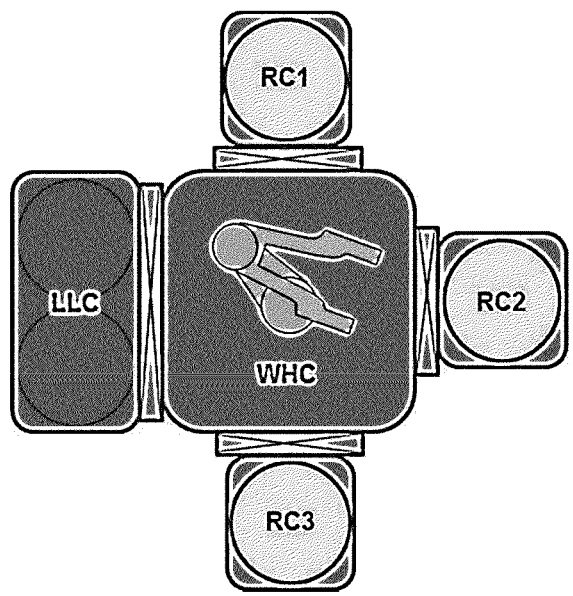
FIGS. 13A and 13B are diagrams of examples of a conventional tool configuration which has a central wafer handling chamber (WHC) combined with load lock chamber (LLC) and reactor chambers (RC) where processes (typically, the same kind of process) are carried out on a substrate.
Figure 13B:
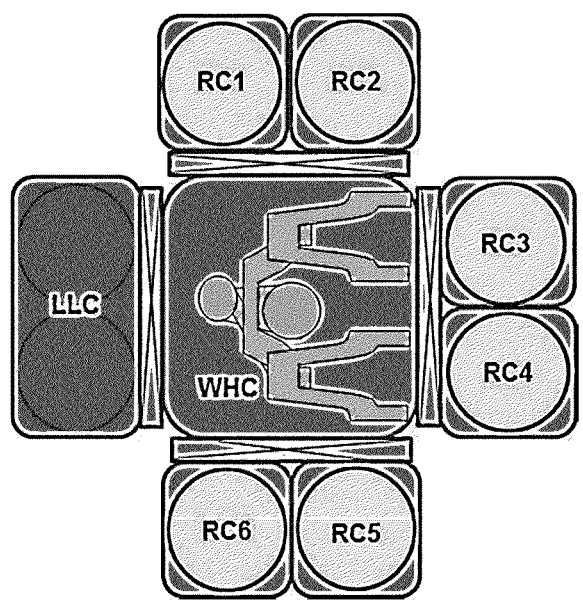

FIGS. 13A and 13B show examples of conventional tool configurations, in which a central wafer handling chamber (WHC) combined with load lock chamber (LLC) and reactor chambers (RC), for carrying out a process on a substrate, which can be the same type of process in each reaction chamber. It is contemplated that performing a multi-process deposition (e.g. the process outlined in FIG. 12) using these conventional tools, only one RC (or unit of RCs) is used at a time while the other RC's stay in waiting status (see FIG. 14, illustrating a process flow for using a conventional tool such as that of FIGS. 13A and 13B for repeating 3 different processes such as shown in FIG. 12 on a substrate).

Figure 15:
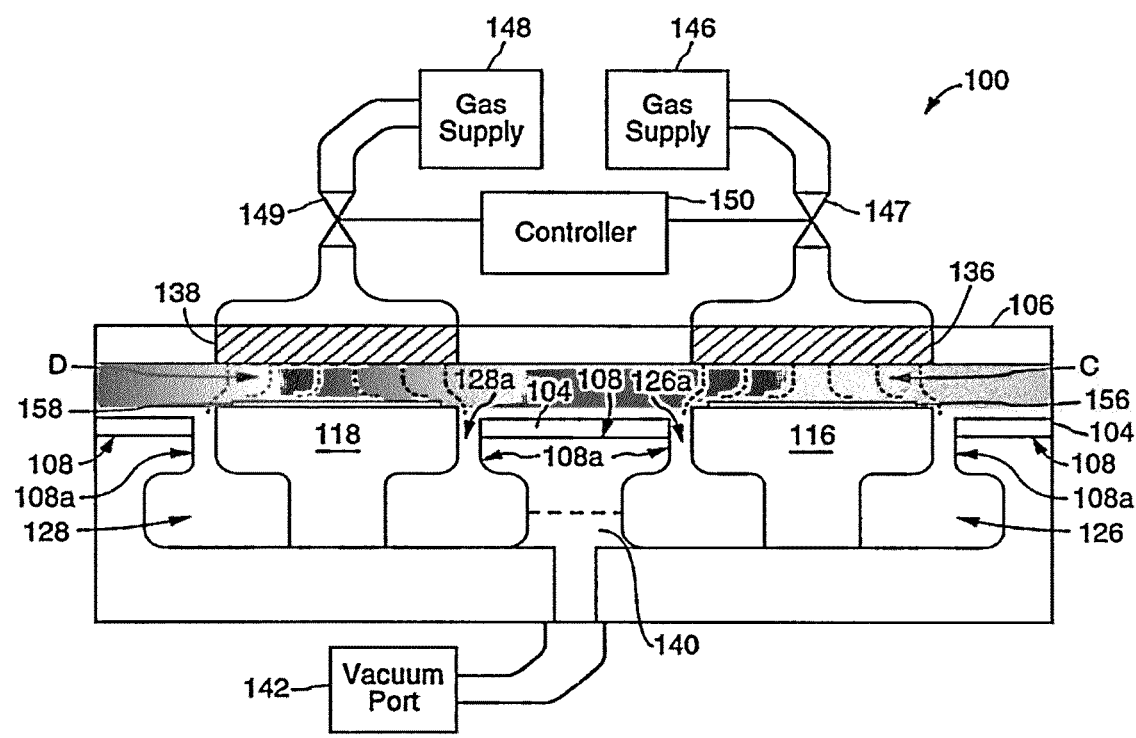
FIG. 15 is a diagram illustrating a conventional apparatus, as can be found in U.S. Pat. No. 6,469,283 B1. It is noted that the reference numerals in this figure correspond to those of U.S. Pat. No. 6,469,283 B1.

FIG. 15, adapted from (U.S. Pat. No. 6,469,283 B1: Method and apparatus for reducing thermal gradients within a substrate support) shows another conventional tool configuration. In this configuration, multiple process stages are located in a process module (PM). Even if different processes are done simultaneously on different stages using such a configuration, the noted configuration has 4 process stages in a PM but each process area is not substantially separated. Accordingly, it is contemplated that the configuration of FIG. 15 fails to prevent interference of process conditions such as gas flow and pressure between each process space, especially when the processes are run under a vacuum. As such, it is contemplated that the noted conventional tools and approaches are not configured to perform well-separated processes in the PM by different conditions. Furthermore, different process gasses meet at common vacuum exhaust port placed beneath the process stages. This structure allows unfavorable gas mixture from different processes, which can potentially lead to a particle issue and safety issues due to byproduct formation.

In some embodiments, a substrate processing equipment comprising one or more process module(s) (PM) provided, in which plural stations in gas isolation from each other are located. The stations can comprise reaction spaces. The substrate processing equipment can comprise at least two substrate transfer systems, one for moving substrates between the load lock chamber (LLC) and the PM, and the other for moving substrates between process stages in the PM. Process stages in the PM can move, so as to configure the stations to be in gas isolation for processing, and to place the substrate(s) in one intermediate space for transfer between stations. In some embodiments, the stations in gas isolation (e.g. substantially separated RCs) in the PM have separated control capability of process parameters such as gasses, pressure, temperature, RF and other parameters as needed. In some embodiments, the PM is configured for gas isolation between the stations at least during the process steps, which effectively works to prevent interference between stations (and/or has a plurality of same-function stations in it). Optionally, the PM is equipped with a capability to run at least two different processes simultaneously in stations in gas isolation from each other (or in a plurality of stations having the same function) by independently controlling process conditions such as gasses, temperature, pressure, RF and other parameters as needed.

Example: TiC Deposition

TiC deposition in a showerhead reactor has suffered from the deposition of low quality layer on the showerhead surfaces. This layer is believed to be the cause for unwanted particle generation in some processes. The deposition of this low quality layer may be avoided by placing a substrate in a first station and adsorbing no more than a monolayer from a titanium reactant such as $TiCl_4$ on an exposed surface of the substrate. The first station is then purged with the substrate inside. The substrate is then lowered from the first station to an intermediate space via moveable stage. In the intermediate space, a spider rotates the substrate to a second moveable stage associated with a second station. The second moveable stage then raises to substrate into the second station, locking the second station into gas isolation, and the substrate is thus placed in a second station in gas isolation from the first station. In the second station, an organometallic Al precursor reacts with Ti on the substrate surface. The second station is then purged, and the substrate is removed from the second station. The substrate is swapped (via the substrate transfer system) between the first and second stations until a TiC film of desired thickness is formed.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

What is claimed is:

1. A reactor for deposition on a substrate, the reactor comprising:
   a plurality of stations in gas isolation from each other, the plurality of stations comprising:
   a first station configured to contain the substrate and provide a first reactant gas to the substrate, wherein the first reactant gas is provided to the first station via a showerhead; and
   a second station configured to contain the substrate and provide a second reactant gas to the substrate, wherein the second reactant gas is different from the first reactant gas;
   a first intermediate space, outside of the plurality of stations, comprising a first purge location, wherein the first purge location is configured to perform a purge with the substrate therein;
   a first movable stage configured to move the substrate between the first station and the first intermediate space;
   a second movable stage configured to move the substrate between the second station and the first intermediate space, wherein a spider is configured to move the substrate from the first movable stage to the second movable stage;
   a plurality of movable physical barriers that define at least a portion of the first station and the second station and configured to move simultaneously with the first movable stage and the second movable stage while maintaining a gap between the first station and the second station, wherein the plurality of movable physical barriers are configured to be moved to expose a substrate in a station to the first intermediate space; and
   a substrate transfer system comprising the spider configured to move the substrate among the plurality of stations via the first intermediate space,
   wherein no surface of the reactor is substantially contacted with both the first reactant gas and the second reactant gas.

2. The reactor of claim 1, wherein the substrate transfer system further comprises:
   a wafer handling chamber located outside the first station and the second station, wherein the wafer handling chamber comprises:
   an end effector configured to transfer substrates from the spider into the wafer handling chamber.

3. The reactor of claim 2, wherein each movable stage comprises lift pins configured to lift the substrate off of the movable stage in the first intermediate space.

4. The reactor of claim 1, wherein the spider is configured to move the substrate after the plurality of movable physical barriers have been moved to expose the substrate.

5. The reactor of claim 1, wherein the first purge location is not in gas communication with either the first station or the second station.

6. The reactor of claim 1, wherein the first station is configured to purge the first reactant gas after providing the first reactant gas to the substrate and before placing the substrate in the second station.

7. The reactor of claim 1, wherein the reactor is configured to prevent a molar ratio of the first reactant gas to the second reactant gas greater than 1:10,000 and a molar ratio of the second reactant gas to the first reactant gas greater than 1:10,000 at any location of the reactor.

8. The reactor of claim 1, wherein the reactor is configured to substantially prevent chemical vapor deposition reactions from occurring on any surface of the first station and the second station of the reactor.

9. The reactor of claim 1, further comprising
one or more solid materials between the first station and the second station, wherein the one or more solid materials provides gas isolation between the first station and the second station.

10. The reactor of claim 1, wherein gas isolation between the first station and the second station is not provided by a gas bearing.

11. The reactor of claim 1, wherein the first station is in a fixed location relative to the second station.

12. The reactor of claim 1, wherein the spider is configured to move the substrate from the first movable stage to the second movable stage by rotation.

13. The reactor of claim 1, further comprising:
a first gas line placing the first station in gas communication with the first reactant gas; and
a second gas line placing the second station in gas communication with the second reactant gas.

14. The reactor of claim 1, wherein the plurality of stations further comprise:
a third station in gas isolation from the first station and the second station, wherein the third station is configured to contact a second substrate with the first reactant gas substantially in the absence of the second reactant gas; and
a fourth station in gas isolation from the first station, the second station, and the third station, wherein the fourth station is configured to contact the second substrate with the second reactant gas substantially in the absence of the first reactant gas.

15. The reactor of claim 1, wherein the plurality of stations further comprise:
a third station in gas isolation from the first station and the second station, wherein the third station is configured to contact the substrate with a third reactant gas substantially in the absence of the first reactant gas and the second reactant gas; and
a fourth station in gas isolation from the first station, the second station, and the third station, wherein the fourth station is configured to contact the substrate with a fourth reactant gas that is different from the first reactant gas, the second reactant gas, and the third reactant gas substantially in the absence of the first reactant gas, the second reactant gas, and the third reactant gas.

16. The reactor of claim 1, wherein the first station is configured to be in gas isolation from the second station prior to placement of the substrate in the first station.

17. The reactor of claim 1, wherein the second station is configured to be in gas isolation from the first station prior to placement of the substrate in the second station.

18. The reactor of claim 1, wherein the first station further comprises a first susceptor comprising a heater, and
wherein the second station further comprises a second susceptor comprising a heater.

19. The reactor of claim 18, wherein the first susceptor is configured to heat the substrate to a first temperature, and wherein the second susceptor is configured to heat the substrate to a second temperature.

20. The reactor of claim 1, wherein the showerhead comprises:
one or more first reactant gas outlets located in a center of the showerhead; and
a scavenger gas located around a perimeter of the showerhead.

* * * * *